United States Patent [19]

Harari

[11] 4,448,400
[45] May 15, 1984

[54] HIGHLY SCALABLE DYNAMIC RAM CELL WITH SELF-SIGNAL AMPLIFICATION

[76] Inventor: Eliyahou Harari, 2320 Friars La., Los Altos, Calif. 94022

[21] Appl. No.: 355,986

[22] Filed: Mar. 8, 1982

Related U.S. Application Data

[63] Continuation-in-part of Ser. No. 282,882, Jul. 13, 1981, Pat. No. 4,417,325.

[51] Int. Cl.³ .................. G11C 11/40; G11C 11/56
[52] U.S. Cl. .................................. 365/185; 357/23; 365/168; 365/182; 365/184; 365/186
[58] Field of Search .................. 357/23 C, 51, 23 VD, 357/23 VT, 23 MG; 365/182, 184, 185, 186, 187, 188, 168

[56] References Cited

PUBLICATIONS

IEEE Trans. Ed., vol. 26, #6, Jun. 1979, Chatterjee et al., "A Survey of High Density Dynamic Ram Cell Concepts".

IEDM Abstracts, 1980, (IEEE Publication), "A New Dynamic Ram Cell for VLSI Memories", Terada et al.

Primary Examiner—George G. Stellar
Attorney, Agent, or Firm—Alan H. MacPherson; Steven F. Caserza; Richard Franklin

[57] ABSTRACT

A dynamic RAM memory cell comprises an MOS read transistor whose conductivity state is determined by the state of charge on a first electrode overlying the read transistor channel region. The first electrode is connected through a buried contact opening to a diffused region in the substrate. This diffusion serves as a junction isolated storage node. This storage node can be charged or discharged through an MOS write transistor. The first electrode is capacitively coupled to a field plate held at a first potential. A control gate formed in a second electrode controls conduction through the write transistor and also allows selective reading in an array of read transistors. Nondestructive read can be achieved together with transistor amplification of the charge stored on the first electrode.

27 Claims, 21 Drawing Figures

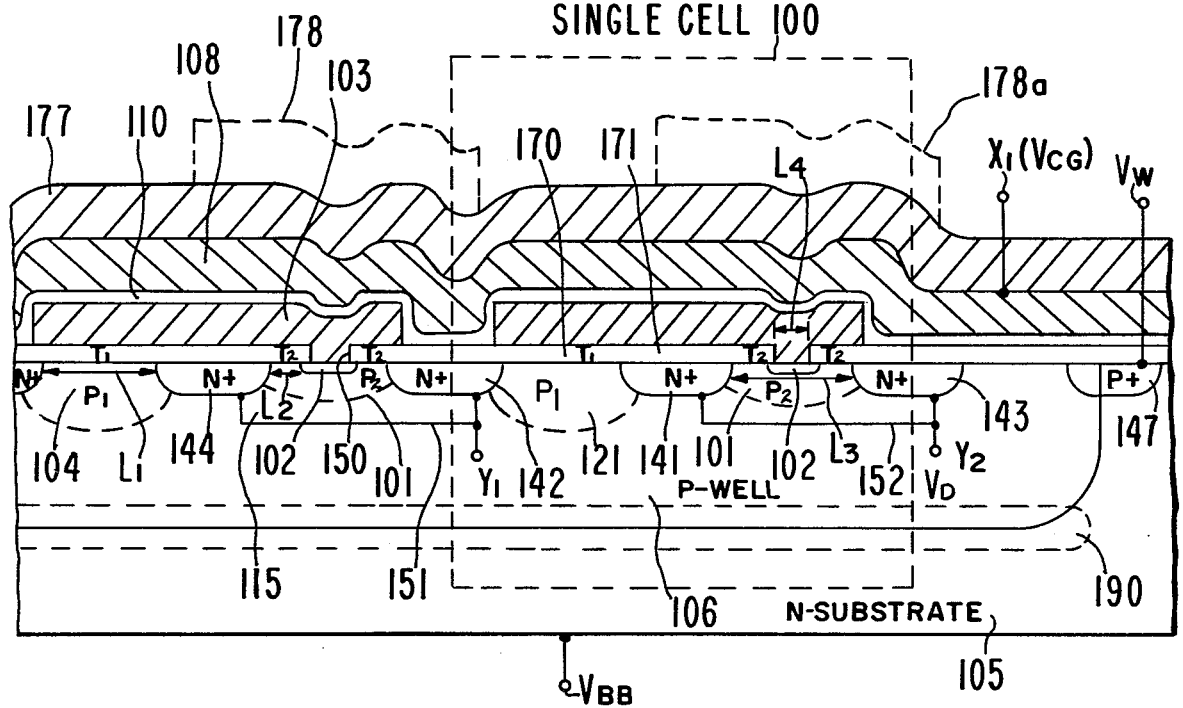
FIG. 1a
SINGLE CELL 100
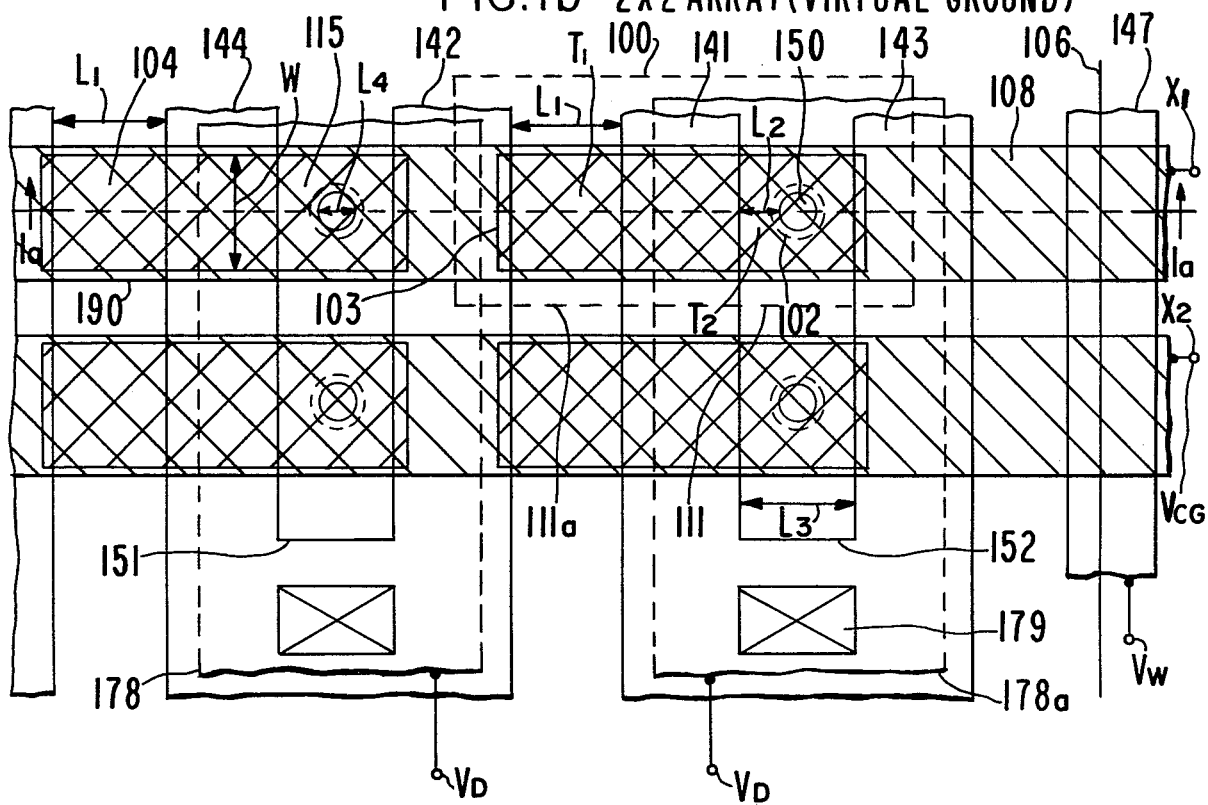
FIG. 1b 2×2 ARRAY (VIRTUAL GROUND)

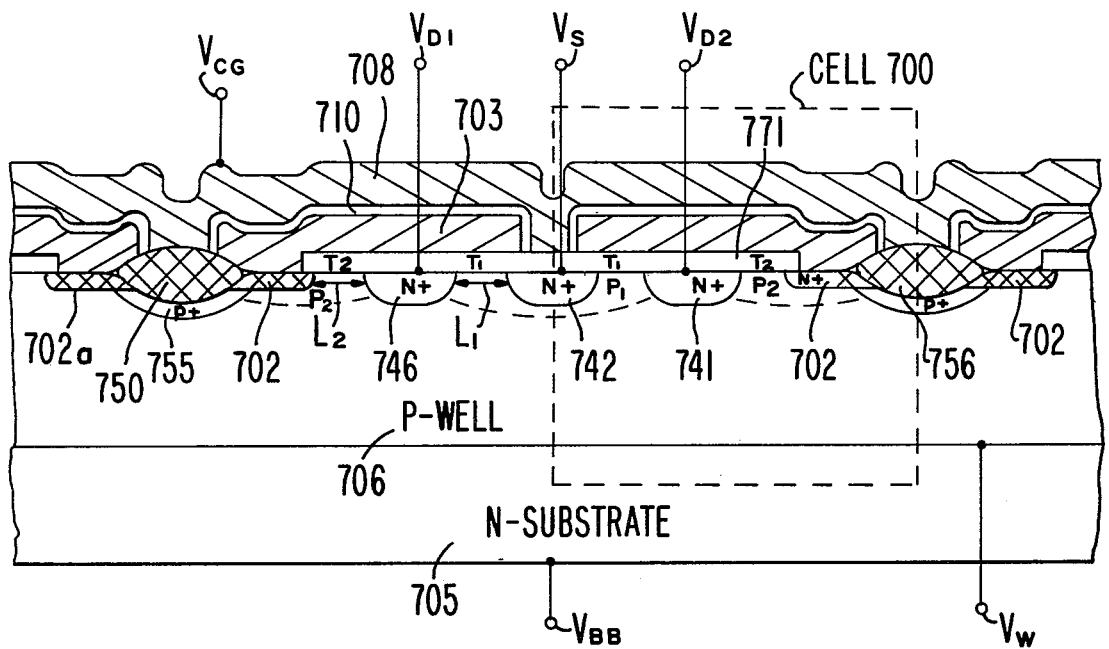
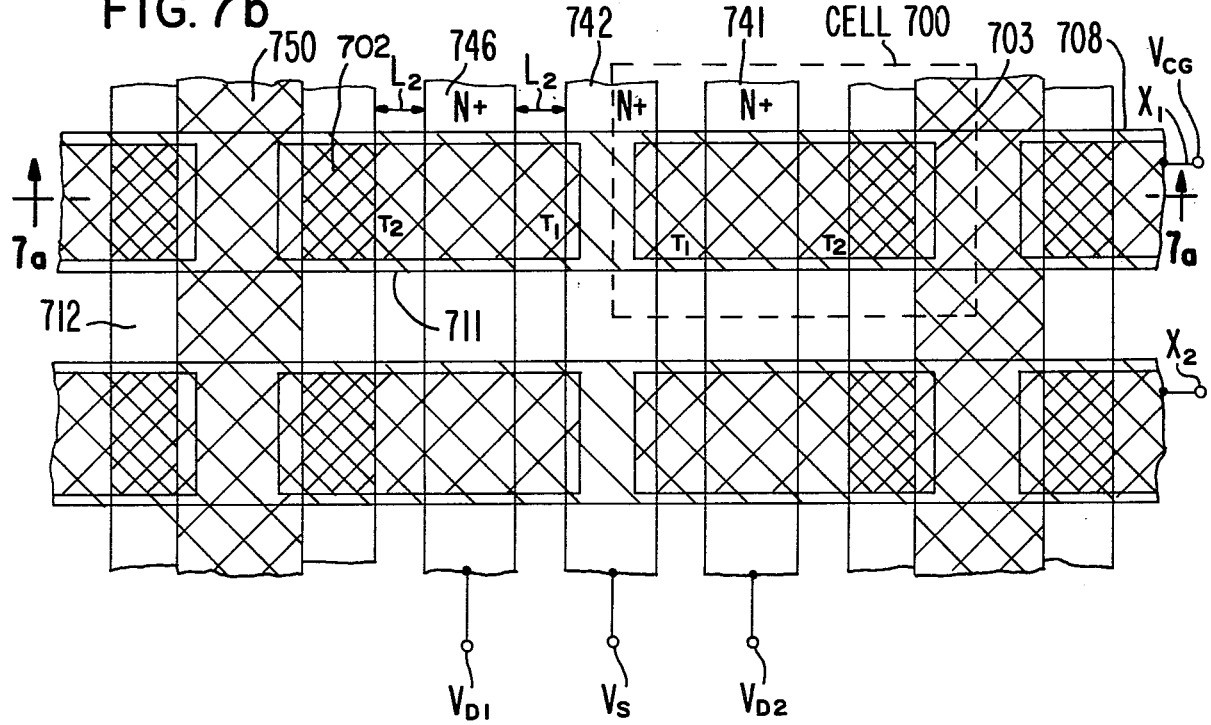

HIGHLY SCALABLE DYNAMIC RAM CELL WITH SELF-SIGNAL AMPLIFICATION

This is a continuation-in-part of co-pending application Ser. No. 06/282,882 filed July 13, 1981 entitled "A Highly Scalable Dynamic RAM Cell with Self-Signal Amplification, now USP 4,417,325."

Field of the Invention

This invention relates to dynamic RAM cells and particularly to a dynamic RAM cell which is capable of being scaled down in size without a commensurate decrease in the amplitude of the output signal from the cell.

PRIOR ART

The most widely used dynamic RAM (DRAM) cell has an access transistor and a passive storage capacitor. A charge packet is stored on this capacitor, introduced there through the access transistor from the bit line diffusion. During read, the presence or absence of the charge on the storage capacitor is detected by dumping the contents of this capacitor onto the bit line and sensing the small fluctuation in bit line potential resulting from the charge splitting occurring between the storage capacitance and the capacitance on the bit line and sense amplifier input node. Because the storage capacitor is limited in area in a large memory array, the signal to be detected by the sense amplifier is extremely small, approximately 50 millivolts in present generation DRAM arrays and less than 50 millivolts in the next generation (256 kilobit) density. Therefore, the memory array requires extremely tight processing tolerances to properly match reference and signal arms of the sense amplifier, and in addition, the memory is easily upset (soft error) by incident high energy particles (alpha particles or cosmic rays) or by current spikes in the substrate.

Clearly a storage device which provides a signal level higher than 50–150 millivolts is a highly desirable device so long as its area per bit is not inferior to the 1 transistor plus 1 capacitor cell.

There has been significant effort in the semiconductor industry to develop a dynamic single transistor storage device which will use transistor amplification to locally amplify the small stored charge. The most commonly proposed cells store charge in the silicon substrate in such a way that the stored charge will affect the threshold voltage of the storage transistor and thereby provide a transistor with two distinct threshold voltage ($V_t$) states. A description of several such cells is provided in the article entitled "A Survey of High Density Dynamic RAM Cell Concepts" by Chatterjee et al (Texas Instruments) published in the IEEE Trans. ED. Vol 26 #6, June 1979 and in an article by K. Terada et al (NEC Japan) entitled "A New Dynamic RAM Cell for VLSI Memories", published in the IEDM Abstracts (IEEE Publication) for 1980.

The new cell of this invention by virtue of its unique features such as a transistor with a dual gate structure, a novel drain structure, storage and amplification occurring on one of the two gates, and the possibility for arraying in a virtual ground circuit design approach, is so distinctly different from all prior art DRAM cells that it cannot really be contrasted with any of them. It achieves the end result of being about half the size of prior art devices (using the same design rules) yet being far more amenable to further scaling to smaller geometrics, and in addition it provides a signal level in the range of 500 to 1500 millivolts as well as being practically immune to all high energy particle upsets.

SUMMARY

In accordance with this invention, a new dynamic RAM cell is described which possesses MOS transistor amplification of the signal stored in the cell. The stored signal, which comprises a charge packet, resides in one embodiment, on a polysilicon gate which is junction isolated from the silicon substrate. The cell includes separate read and write transistors both controlled by the same junction isolated polysilicon gate. A control gate tightly coupled to the junction-isolated gate is used for charging or discharging the isolated storage gate and for reading the read transistor whose channel is partially or completely spanned from source to drain by the junction-isolated polysilicon gate. The source and drain diffusions can be shared between adjacent cells in a memory array to yield a very high density "virtual ground" memory design.

In one embodiment the junction isolating the storage gate is surrounded at a distance by an annular shaped drain diffusion, which serves as the gate of a vertical JFET. In normal operation, this JFET is turned off, to completely decouple the junction and its storage node from the substrate. In this embodiment read and write are non-destructive.

In another embodiment there is no vertical JFET drain isolation and the write operation requires first reading, then rewriting the stored data the same as for a refresh operation.

In all embodiments of the new device, the stored signal is equivalent to approximately one (1) volt difference on the gate of the read transistor for a five volt (5 v) supply. This provides an easily detectable signal. Intermediate levels of the stored signal can be achieved during the write operation, enabling multi-level storage at each memory cell. Furthermore, the device is highly immune to upset by soft errors due to incident alpha particles. Additionally, because the stored charge resides on the gate of the read transistor rather than on a storage capacitor, the cell is highly scalable, with signal level being maintained regardless of how small the cell is made.

The new device can also be used as a reference cell in a sense amplifier allowing generation of intermediate reference signal levels. The same feature can be used in the memory array for multi-level storage.

DESCRIPTION OF THE INVENTION

FIG. 1a shows a cross-sectional view of two DRAM cells sharing a common control gate in a virtual ground (shared source/drain) array;

FIG. 1b shows a top view of a 2×2 virtual ground array of the cells shown in FIG. 1a, FIG. 2 shows the timing sequences for (a) write "0", (b) write "1", (c) read;

FIG. 4b shows in top view the structure of FIG. 4a;

FIG. 7a illustrates a DRAM embodiment with storage junction partially bounded by oxide field isolation in cross-section along 7a—7a of FIG. 7b showing two DRAM cells sharing a common source diffusion;

FIG. 7b shows in top view a 2×2 array of shared source cells the cross-section of which is shown in FIG. 7a;

DRAM CELL CONSTRUCTION

Figure 2:
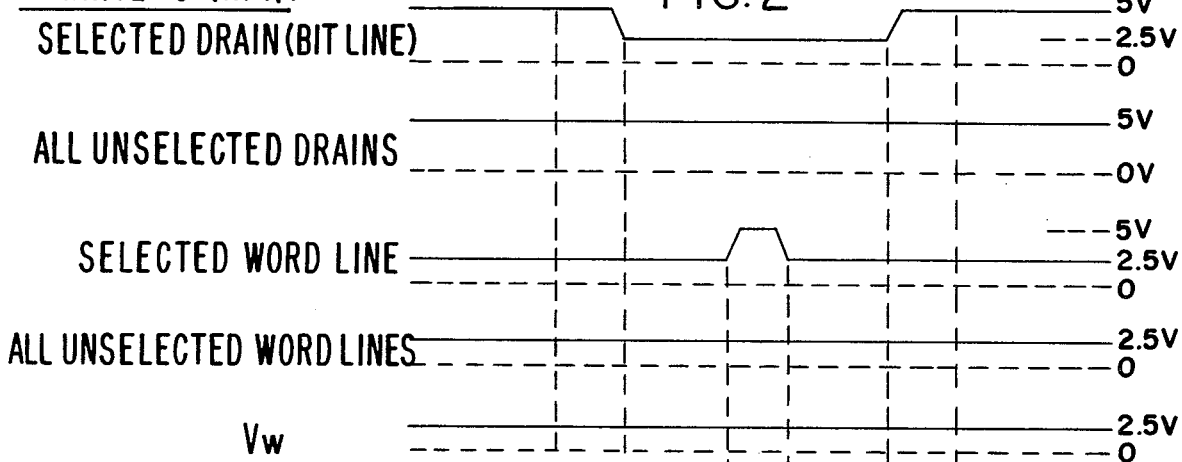
Figure 2:
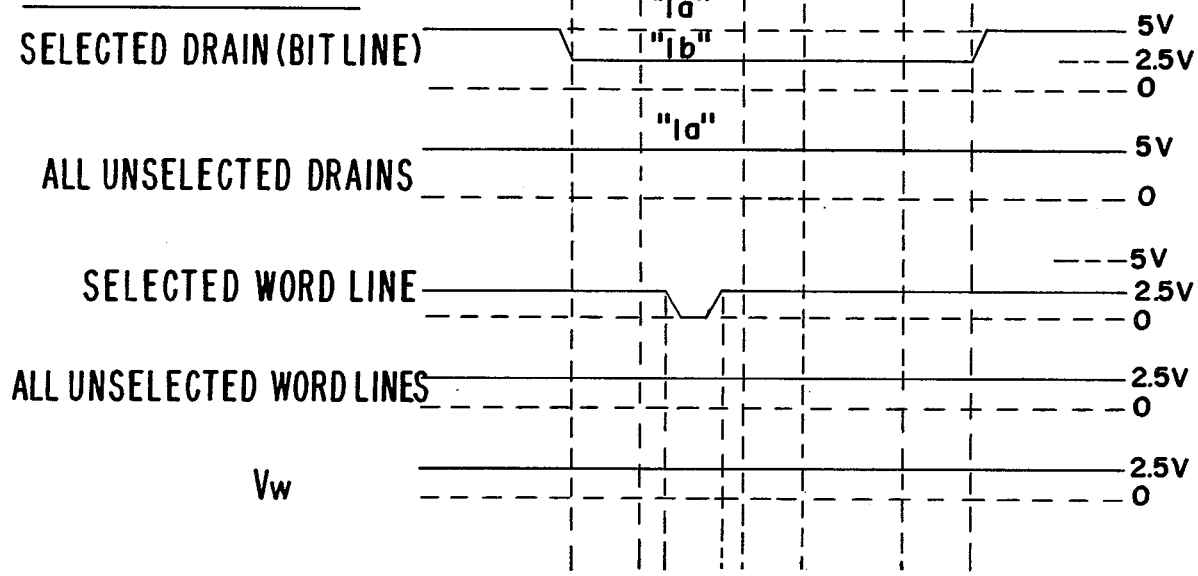
Figure 2:
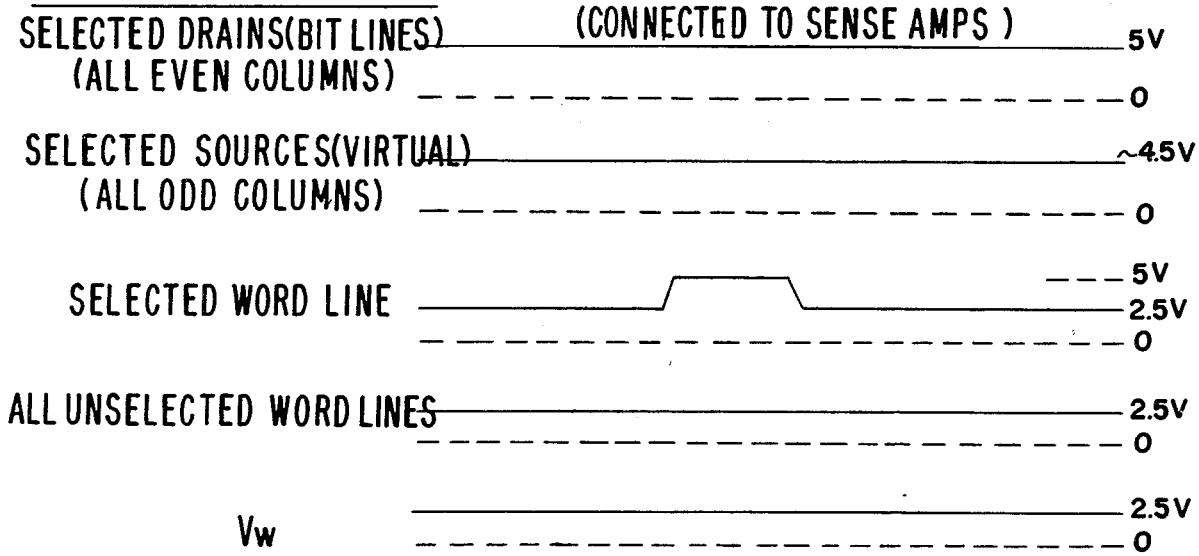

Two cells of one embodiment of the basic DRAM (Dynamic Random Access Memory) of the new invention are shown in FIG. 1a in cross section and FIG. 1b in top view (2 by 2 array). In one embodiment, a single cell 100 is constructed by starting with a lightly doped N-type substrate 105 and forming a P well 106, typically by diffusion, to a depth ranging from 2 to 12 microns. The cell can also be formed in a p substrate (as opposed to a p well in an N substrate) or in a p-type epitaxial silicon layer formed over an N substrate. When a p-type epitaxial silicon layer is used, the P well resistance can be greatly diminished by forming a buried P+ diffusion (shown by dotted line 190) prior to epi growth. Into the P well 106 are diffused N+ regions 141, 142, 143, 144, which can either be shallow (0.2 to 0.6 microns) diffusions formed with Arsenic dopant, or for another embodiment of the basic cell they are deep (1.0 to 3.0 microns) diffusions formed with phosphorus dopant followed by a drive cycle. A gate dielectric 170 is formed whose thickness 171 is greater over the N+ diffusions because of enhanced thermal oxidation rate. The substrate doping P1 (121) in what will become the channel of the read transistor T1 is, in one embodiment, introduced at this time, as is the P2 doping 101 in the region outside the read channel which will eventually become the channel of the write transistor T2. P1 and P2 may have the same doping concentration and profile but they serve different purposes and optimum device performance may require that they be different. In this respect, P1 has the function of determining the threshold voltage VT1 of read transistor T1 and of preventing bulk punchthrough between source 142 and drain 141 diffusions. P2 controls the threshold voltage VT2 of write transistor T2 but need not have as deep a profile as P1 because punchthrough between diffusions 141 and 143 (or 142 and 144) is not a concern since they are electrically shorted together as shown by diffusions 151 or 152 in FIG. 1b. (Column N+ diffusions such as 141 and 143 in a memory array may be shorted together by a similar N+ diffusion shown by 151 in FIG. 1b made once every cell or once every 8, 16 etc number of cells, or by a continuous metal strap such as 178a, 178b running above the diffusions parallel to them and connecting the two diffusions every once in a while along the column through a contact via 179 made in the passivation layer 177. The key requirement on P2 is that it be sufficiently deep and sufficiently highly doped (0.5 to 1.0 micron and $5 \times 10^{15}$ cm$^{-3}$ to $5 \times 10^{16}$ cm$^{-3}$ respectively) to prevent under all operating voltage conditions surface punchthrough between diffusions 141, 143 on the one hand and shallow N+ diffusion 102 formed in an opening 150 in the gate dielectric 170. This opening, of diameter L4, is at a distance L2 from the edge of drain diffusions 141, 143. Opening 150 is a buried contact through which a polysilicon gate 103 heavily doped with an N-type impurity such as arsenic or phosphorus makes a junction contact 102 to the P-well 106. The junction can be formed by arsenic doping from the polysilicon into the P silicon 101 or it can be a schottky junction if the gate 103 is formed of a metal silicide or a refractory metal.

Dopants of opposite polarity to those shown are used in a PMOS DRAM in an implementation of an embodiment of this invention using conductivity types opposite to those shown in the NMOS DRAM described here. A PMOS DRAM is equally acceptable of being used to implement this invention as is the NMOS DRAM described here.

Diffusions 141 and 143, which serve as the the drain of transistor T1 therefore enclose within the spacing L3 between them a second transistor T2 whose source is either one of diffusions 141 or 143 (or both since they are shorted together), whose drain is diffusion 102 at the center of the opening L3 between 141 and 143, whose gate 103 is the same gate as that controlling the read transistor T1, and whose channel length is L2 and channel doping is P2. Because N+ diffusion 102 is more shallow than diffusions 141, 142, 143 and 144, P2 need not have the deep profile of P1 to achieve protection against source/drain punchthrough in transistor T2. Junction 102 serves to electrically isolate gate 103 from all other such gates sharing the same P substrate 106.

Gate 103 is capped with a thin dielectric 110 such as thermal silicon dioxide or thermal silicon nitride or a deposited CVD nitride or oxide, or any combination thereof which will maintain good isolation yet provide strong capacitive coupling between gate 103 and a second control gate 108. Control gate 108 is formed from polysilicon (heavily N+ doped) or a silicide or a refractory metal or an aluminum alloy. Edge 190 (FIG. 1b) of gate 108 can be used to define and etch also the parallel edge of gate 103, much in the same way that self aligned double polysilicon structures are commonly formed in a SAMOS (self aligned MOS) process used in EPROM device manufacture. In a memory array gate 108 forms the control gate word lines X1, X2 running perpendicular to the diffusions Y1, Y2 (144, 142 and 141, 143 respectively). Isolation regions 111 (FIG. 1b) between adjacent word lines are doped with boron channel stops formed by ion implantation using the etched gates 108 and 103 as a mask to define a self aligned field isolation. This channel stop doping is usually followed by a thermal reoxidation cycle, to mask and thus protect the channel stop from any counterdoping from the phosphorus in the subsequently deposited and flowed phosphorus glass 177. Contact openings 179 and metal deposition and definition 178a, 178b then follow in a standard process sequence.

Examining now the single cell (shown by dashed line 100) of FIG. 1a we see that N+ diffusion 142 serves as the source of transistor T1 of the cell, but inasmuch as it is electrically shorted to diffusion 144, it serves also as the drain of transistor T1 of the cell to the left. It also serves as an N+ channel stop between the P1-type channel region 121 of T1 of the cell 100 and the P2-type channel region 101 of T2 of the cell to the left. Similarly, N+ diffusion 141 serves as drain of transistor T1 as well as a channel stop between the P1 type channel of T1 and P2 type channel of T2 of the same cell. This multipurpose role of the N+ diffusions as source/drain/channel stop allows for a very dense virtual ground circuit design approach for a memory array.

Apart from the method of formation of junction contact 102 within the aperture opening L3 in the drain diffusion, the process flow is quite similar to NMOS or CMOS processes commonly used for fabrication of dual polysilicon CCDs or EPROM arrays. Periphery devices such as decoders, sense amplifiers and clocks can be formed either in NMOS or in CMOS in other P wells formed in the same substrate 105. This feature is particularly useful if the memory array is intended for operation from a single 5 V supply as will become apparent in describing the modes of operation. A later section will describe several methods for forming in a well-controlled process the dimensions L4 of the drain aperture as well as L2. Dimension L3 is not of critical importance so long as it is not so small as to significantly degrade the forward impedance characteristics of junction 102.

Construction of other embodiments of the cell will be described in subsequent sections.

Principle of Operation

Device 100 (FIG. 1a) operates as a dynamic memory element by storing either excess electrons (high Vt state="0") or excess holes (low Vt="1") on its junction isolated gate 103. The voltage $V_D$ of drain diffusions 141, 143 as well as the P-well potential Vw play a key role in the write "0", write "1" and read mechanisms. To achieve proper operating conditions the control gate voltage $V_{CG}$ must have excursions above and below the Vw voltage. For a 5 V operation Vw must be maintained at an intermediate potential, approximately +2.5 V, while the control gate must have voltage excursions between +2.5 V and +5.0 V for write "0" and between 2.5 V and 0 V for write "1". For a circuit operation where a +5 V and −5 V supply are provided the P well can be maintained at Vw=0 V and the control gate then goes from 0 V to +5 V for write "0" and from 0 V to −5 v for write "1". Both cases require that the memory array be fabricated in a P well in an N substrate or that the peripheral drivers and control gate decoders be fabricated in an N well in a P substrate, so that proper voltage swings on the word line can be generated with the necessary excursions to voltages higher and lower than Vw, the substrate potential in the memory array. The operating modes, assuming a 5 V supply and a P-well substrate, are now described.

(a) Write "0" (high Vt)

With the 5 V supply the p well of cell 100 (FIG. 1a) is kept at Vw=2.5 V while the N substrate Vbb is at +5 V at all times. The Vw voltage can be maintained by a potential divider from the 5 V supply. Vw does not need to supply a high DC component under any mode of operation and therefore this intermediate voltage level is not a major drain on power. To write "0" on the gate 103 of the selected cell 100 its drain 141, 143 is kept at +2.5 V (same as Vw) while its control gate goes up from +2.5 V (standby condition) to +5 V for the duration of the Write "0" pulse (typically 20 to 100 nanoseconds). Because of the strong coupling between gate 103 and control gate 108 gate 103 goes up to a voltage close to +5 V (typically 4.0 V to 4.5 V, depending on the ratio of coupling of 103 to control gate 108 to coupling of 103 to all other conductors surrounding 103). Since transistor T2 has a threshold voltage set at $V_{T2} \cong +1.5$ v its channel L2 becomes inverted since its gate 103 to source/drain 141 voltage difference is 4.5−2.5=2.0 V. Electrons can then flow onto 103 from source diffusion 141. The quantity of electrons flowing is just sufficient to turn T2 off since with the control gate voltage at 5 v the electrons on gate 103 quickly reduce the inverting field on L2, in effect neutralizing the effect of the voltage on gate 108.

So long as $V_{CG}$ is at 5 V the junction 102 is reverse biased even with the electrons now stored on it. As soon as $V_{CG}$ is brought back to 2.5 V at the completion of the write "0" cycle the stored electrons cause N+P junction 102 to become forward biased, leaking the electronic charge into the substrate P well. Therefore, the voltage on first gate 103 a few nanoseconds after the completion of the write "0" cycle is back to approximately 0.5 V (one forward biased diode drop) below Vw. This operation therefore results in a very solid and reproducible "0" state, pegged to the value of Vw. The correct timing sequence for $V_{CG}$, Vw and $V_D$ pulses on the selected and all unselected cells in an array such as the 2×2 array of FIG. 1b is given in FIG. 2a. All unaccessed columns (bit lines) have their $V_D$ at 5 V prior to raising the control gate to 5 V so that their enhancement transistor T2 is prevented from turning on. This effect is reinforced particularly if the source body effect is strong for transistor T2, which effectively raises the value of VT2 on unaccessed cells having their source/drain diffusion at 2.5 volts above their substrate (p well) potential. Unaccessed cells on the accessed column bit line do not present a problem either since their T2 transistor has $V_D$=2.5 V, Vw=2.5 V and $V_{CG}$=2.5 V so they too are prevented from turning on (i.e. prevented from writing "0").

The selected bit first has its drain (column bit line) dropped to 2.5 V, then its control gate (word line) momentarily raised to 5.0 V, as shown in FIG. 2a.

(b) Write "1" (low Vt-depletion threshold)

In this mode transistor T1 has holes injected onto its gate 103 from the P well 106. The holes on gate 103 reverse bias the N+P junction and therefore remain trapped until discharged by generation recombination currents in the junction space charge region. Discharge time is several milliseconds at 125° C. to several second at room temperature, similar to the discharge time of prior art DRAM cells. Injection of substrate holes takes place through a charge pumping mechanism as follows:

The selected cell to be written "1" has its drain 141, 143 at $V_D$=2.5 V (Vw=2.5 V and Vbb=5 V, same as for all other modes of operation) while its control gate 108 is taken momentarily from 2.5 V to 0 V then back to 2.5 V. The strong coupling between gates 108 and 103 causes gate 103 to go to a potential more negative than the P well Vw when $V_{CG}$ is at 0 V. This forward biases N+P junction 102 thereby injecting holes from the P well onto N+ doped gate 103. The quantity of hole charge packet injected, ΔQh is determined by the ratio of the capacitance coupling gate 103 to the control gate 108 to the capacitance coupling gate 103 to all other surfaces coupled to 103, that is $$\Delta Qh \propto \frac{CFG}{CTot} \quad (1)$$

where CFG is the capacitance between 103 and 108 while CTot is the total capacitive coupling to 103. The two main components of CTot are CFG and $C_D$, the coupling capacitance between 103 and drain diffusions 141, 143 (see equivalent circuit, FIG. 6a). Once control gate 108 potential is brought back to 2.5 V the holes trapped on 103 have the same effect on transistors T1 and T2 as that of a positive gate voltage on 108. Therefore, the voltage $V_{CG}$ required to switch on transistors T1 (read transistor) and T2 (write "0" transistor) is lowered, and may in fact become depletion threshold for T1. Of course if T2 is allowed to have a depletion threshold when holes are stored on 103 then it will be turned on allowing electrons from drain 141 to discharge just enough of the trapped holes on floating gate 103 to raise the effective VT2 so as to shut it off thereby preventing further neutralization of the trapped holes. This is similar to a fill and spill concept known in Charge Coupled Devices: the reverse bias isolated gate 103 first has excess holes charge-pumped onto it, then transistor T2 partially discharges these holes to a level $\Delta Qh$ fixed by the threshold voltage VT2. If T2 is fabricated with a higher VT2 (+2.5 to +3.5 V) then it may not be turned on even with the maximum hole charge packet on 103. In that case $\Delta Qh$ has no relation to VT2. The duration of the hole injection pulse is of the order of a few nanoseconds, dependent to a large extent on the impedance of the forward biased N+p junction 102 and the substrate (p-well) resistance.

An interesting feature of this device is that if VT2 is set sufficiently high (+2.5 to +3.5 V) so that $\Delta Qh$ is not controlled by VT2 but is instead related to the coupling capacitances (equation (1)) and to the voltages on each surface coupled to 103, then multiple values of threshold VT1 can be obtained for the "1" state by controlling $\Delta Qh$ via placing one of the several value of drain voltages $V_D$ on diffusions 141,143 during the time the word line goes from +2.5 V to 0 V. For example, the "1" will have more holes trapped on 103 (greater negative threshold voltage shift with respect to the "0" threshold voltage) if $V_D = +2.5$ V during write "1" than when $V_D = +5$ V during write "1" (the more positive potential on drains 141, 143 partially offsets the control gate charge-pumping effect, resulting in a reduced $\Delta Qh$ and therefore a reduced negative threshold shift, or an intermediate "1" state). In fact the cell can operate either as a tri-state storage element (requiring a tri-state sense amplifier), or the two threshold levels of the "1" state (obtained with $V_D = +2.5$ V and $V_D = +5$ V) can be used as the "0" and "1" states, which eliminates the need for the write "0" operation described earlier. Alternatively, the intermediate "1" state can be used as the reference state in the sense amplifier. The use of more than binary storage with this cell relies entirely on circuit design considerations, i.e. the ability to sense more than a binary state and to write or refresh more than "0" and "1" states. However, because of the relatively large threshold window available between the "0" and "1" states, it should be relatively straight forward to store, detect, write and refresh multiple states at each cell.

Note that in all the preceeding discussion the value of threshold voltage VT1 does not affect the threshold voltage in states "0" and "1". VT1 influences only the sense current during the read mode.

In the simplest cell implementation (VT2=0.5 V to 1.5 V resulting in fill and spill) and "1" state results in a positive potential on 103 equivalent to approximately 1 volt lower threshold on control gate 108 than for the "0" state. This 1 volt window is of course the basis for the large read signal provided by the cell: We see that a relatively small charge packet ($\Delta Qh$) which would be extremely difficult to detect by itself if dumped through a high capacitance long column diffusion onto the sensing node of a sense amplifier is translated by the gate 103 of transistor T1 (on which $\Delta Qh$ is stored) into two distinct threshold states for gate 108 with approximately 1 volt difference, providing effectively a huge transistor T1 amplification of $\Delta Qh$.

The write "1" operation for the cell of FIG. 1a results in all cells sharing the same control word line 108 also being written into "1" state. Essentially write "1" is a "clear" operation for all cells along the common word line, much like the write or read operations in present day DRAM arrays are also destructive, requiring sensing and rewriting the information stored in each cell. As discussed below, another embodiment exists which can result in nondestructive write "1".

The timing sequences for write "1" are shown in FIG. 2b for the selected and all unselected cells. States "1a", "1b" are the two "1" threshold states for two different $\Delta Qh$ values described above, depending on the value of $V_D$ during the charge-pumping write pulse. All unselected bits along the selected row (word line) are seen to be written into "1a" state. For that reason, circuit design considerations may dictate that the selected bit line also be kept at 5 V (same as for all unselected bit lines) so that "1a" is the only state "1".

Writing "0" into a cell which is in state "1" is not a problem because the holes on 103 reduce the effective VT2 and make it easy for electrons from drain 141, 143 to flow through the T2 inversion layer to recombine with the excess holes. Similarly, unaccessed cells written into state "1" are not disturbed by a write "0" operation on an accessed cell sharing the same word line, because their T2 source (141, 143) is at +5 V (versus +2.5 V for the accessed cell) and therefore T2, even if it stores a "1", does not turn on when its gate 108 goes up to 5 V.

We see therefore the controlling influences of the voltage on source/drain diffusions 141, 143 in protecting against write "0"-disturb ($V_D = +5$ V) as well as providing electrons for write "0" in accessed cells ($V_D = +2.5$ V). The drain potential is used to advantage also during the read operation to be described next. Also, another embodiment of the DRAM to be described later has a vertical JFET formed within the drain diffusion which results in uniquely different operational characteristics.

(C) Read (for virtual groung array).

Reading is a fairly simple operation since each bit line (column) has its own sense amplifier so that an entire row of cells is read at once, as in all prior art DRAMS's. There are additional circuit design considerations resulting out of the virtual ground approach, which do not exist in non-virtual ground arrays. Array approaches different from the virtual ground will be discussed in a later section.

For the selected cell, read is achieved by first bringing its drain 141, 143 from +2.5 V to +5.0 V, and its source 142 to approximately 4.0 to 4.5 V (virtual source, or virtual ground). The control gate is then taken from +2.5 V to +5.0 V and current through transistor T1 is monitored and contrasted with a reference. Either current or voltage sensing can be used; in the latter case the drain diffusion at +5.0 V is connected to the sense amp node, and if the cell is in its low VT1 state ("1") it will conduct, dropping the +5 V towards the source potential. If in "0" state it will stay at +5 V or drop more slowly than the reference side of the sense amp. Latching the sense amplifier in the correct state takes typically 10 to 50 nanoseconds. So long as the sense amp is prevented from pulling the sensed column below approximately 4.5 V, the reading is non-destructive, unlike prior art DRAMs. This is because transistor T2 in any of the cells is off during all phases of reading. This is the key reason for specifying that for the virtual source array the source voltage be kept at 4.0 V or higher during read. Otherwise T2 of the unaccessed cell to the left may become weakly turned on during read, losing part of its state "1" trapped holes-a "read disturb" condition which is undesirable. Fortunately this problem is minimized or entirely eliminated by the source-body effect: with $V_W = +2.5$ V, VT2 is higher when $V_D = 4.0$ V (where the source/drain is used as a virtual source), than when $V_D = 2.5$ V (where the same source/drain is serving as the drain of a cell written into "1"). In other words the source body effect ensures that transistor T2 of the diffusion 142 serving as source is not turned on during reading a "1" state. In non-virtual ground memory arrays (to be described below) this "read disturb" condition is eliminated entirely since the cell uses a source diffusion exclusively for the reading operation in conjunction with transistor T1.

With the virtual ground array since each bit line diffusion serves as the drain of one bit or the source of the bit to the right, only half the bits along a word line can be read in a single cycle. Therefore, half the sense amps are latched first, then the sources and drains change roles and the remaining sense amplifiers are latched. This is only a problem for read, not for write "0" or write "1", where all bits in a row are written in a single cycle. Non virtual ground arrays with dedicated drain and source diffusions for each cell do not have this problem and an entire row can be read in a single cycle (note that virtual ground ROM or EPROM arrays also don't have this problem because they do not have the requirement that the entire row of cells be read/refreshed each cycle).

Timing sequence for the read pulsing is shown in FIG. 2c.

Read Interference

Read interference effects can exist in the virtual ground array of FIG. 1b if the state "1" threshold VT1 is a depletion threshold. In that case, if the cell to the right of the accessed cell is in state "1" it will pull up drain 141, 143 of the accessed cell even as the accessed cell itself (if it's also in the "1" state) tries to pull the drain towards the source potential. The simplest way to overcome this problem is to set the doping level p1 (FIG. 1a) such that VT1 is enhancement for both "0" and "1" states. This turns out to be the case almost naturally because of the body effect which raises the threshold $V_{T1}$ when the source potential of T1 is higher than the p-well potential.

(d) Refresh.

Refresh is required for each cell in an array at every specified time interval, typically every 2 to 4 milliseconds. As in prior art DRAMs, refresh in the cell of the present invention takes place a row at a time. The timing sequence is as follows:

First, all cells in the row are read, using the sequence of FIG. 2c (two steps, one for each half of the cells in the row). The data is stored on the latched sense amps, one per each bit line. Next, all cells along the row undergo a write "1" as in FIG. 2b (equivalent to a "clear" operation). Finally, using the data stored on the sense amps those cells previously in "0" state are written back into that state using the timing sequence of FIG. 2a.

For a read/modify/write cycle the new modify data is latched from the I/O bus onto the sense amps after the write "1" operation but before the write "0" final step.

Other Embodiments

1. Cell With Split Gate

Figure 3:
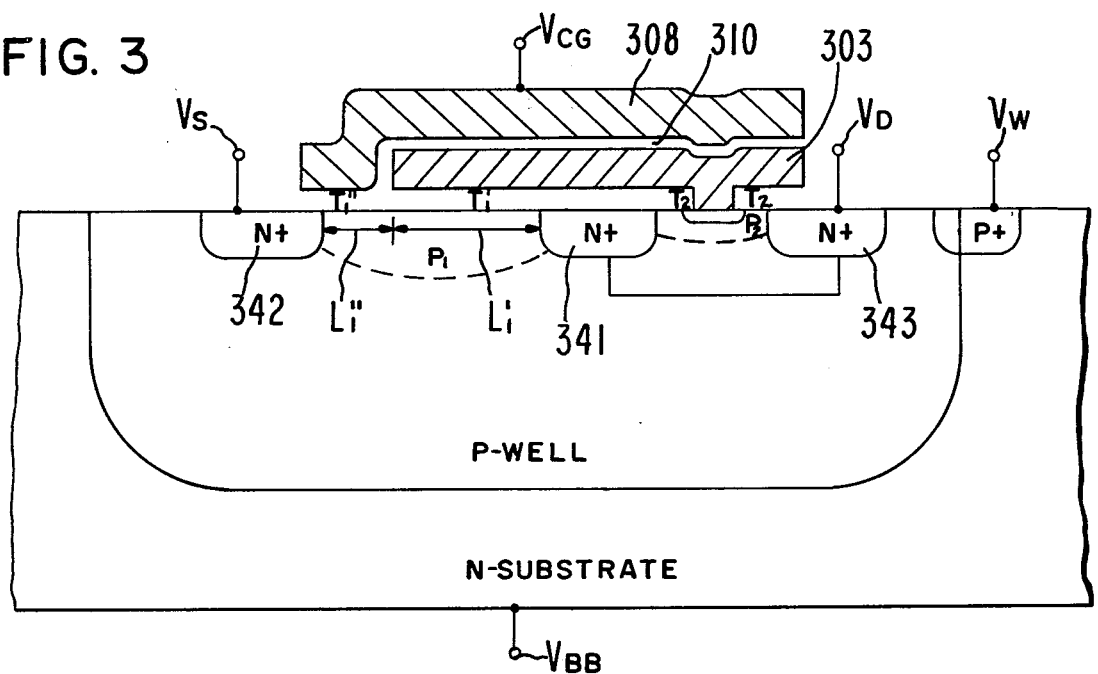
FIG. 3 illustrates a DRAM embodiment with split gate read transistor.

An extension of the basic cell 100 of FIG. 1a is a cell with a split gate read transistor T1. As shown in FIG. 3, the read transistor has two portions L1', L1" of its channel. T1' is controlled as before by the junction-isolated storage gate 303, which may have a depletion threshold for its "1" state. T1" is an enhancement fixed threshold transistor controlled entirely by control gate 308. This cell is slightly larger than cell 100 and is used only if the "1" state is a depletion threshold. In all other respects (write "1", write "0", and read) its operation is identical to cell 100.

2. Cell With Drain Vertical JFET

Figure 4A:
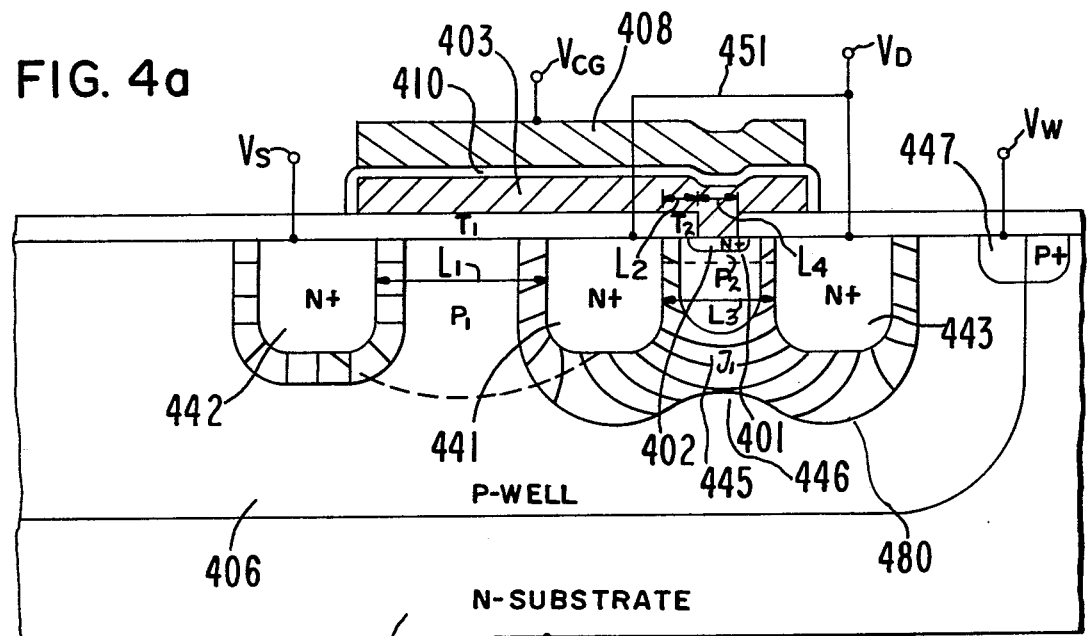
FIG. 4a illustrates in cross-section a DRAM embodiment with deep junctions forming a vertical drain JFET.
Figure 4B:
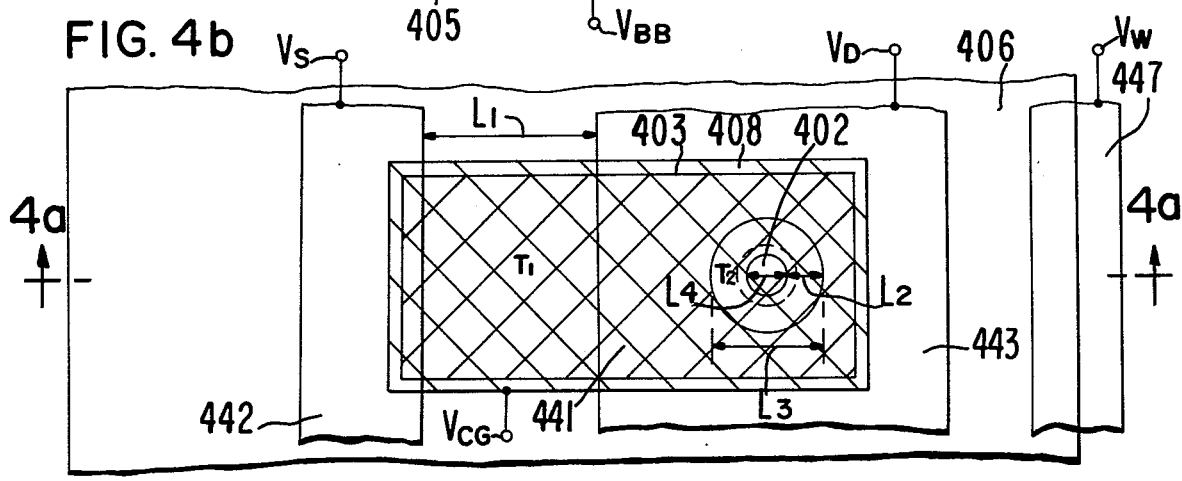

The cell 100 of FIG. 1a can be fabricated with very deep (1.5 to 3.0 microns) N+ drain diffusions and with a small annular aperture opening L3. The resulting cell is shown in FIG. 4a (cross section) and 4b (top view—only a single cell shown). The dual gate structure is identical to cell 100, including N+ doped first gate 403 making an N+p contact 402 to the p2-doped silicon in the aperture opening in the drain diffusions 441, 443. 441 and 443 are connected together (shown by 451 in FIG. 4a) by making the aperture a circular opening of diameter L3 in a continuous N+ diffusion (FIG. 4b). If the p-well doping is sufficiently light then when $V_D$ is taken above Vw the space charge regions 480 emanating from the N+p junction will widen with increasing $V_D$ and eventually merge together at 445. The voltage $(V_D - V_W)$ at which this occurs is known as a pinchoff voltage for JFET devices. The aperture in the drain with the surrounding drain diffusion indeed forms a JFET, with N+ circular gate 441, 443, p2 doped drain 401, p-well channel 445 of diameter (width) L3, and p-well 446 source. We see, therefore, that by maintaining $V_D$ at a voltage higher than pinchoff with respect to Vw it shuts off the electrical path between N+p junction 402 (and its gate 403) from the p-well, i.e., the storage gate 403 and its associated junction 402 become essentially decoupled from the p-well (and all other storage gates sharing the p-well) through the high impedance switched-off vertical JFET in the drain diffusion aperture. Typical pinchoff voltage is 0.5 V to 1.5 volts. Therefore with $V_W = 2.5$ V and $V_D = 5.0$ V, all cells sharing the drain diffusion are pinched off and are therefore protected from any disturb condition. In fact, referring to the section describing write "1", it is clear that charge pumping of 403 through injecting of holes from the p-well can be prevented in all but the column containing the selected cell by keeping all unselected columns at $V_D = +5$ V during the write "1", resulting in JFET isolation and no hole injection. This cell therefore allows the flexibility of write "1" by bit or write "1" for the entire row (by taking all columns to $V_S=V_W=2.5$ V, thereby fully turning on the JFET and allowing a low impedance path to the p-well for hole injection to take place).

Figure 5A:
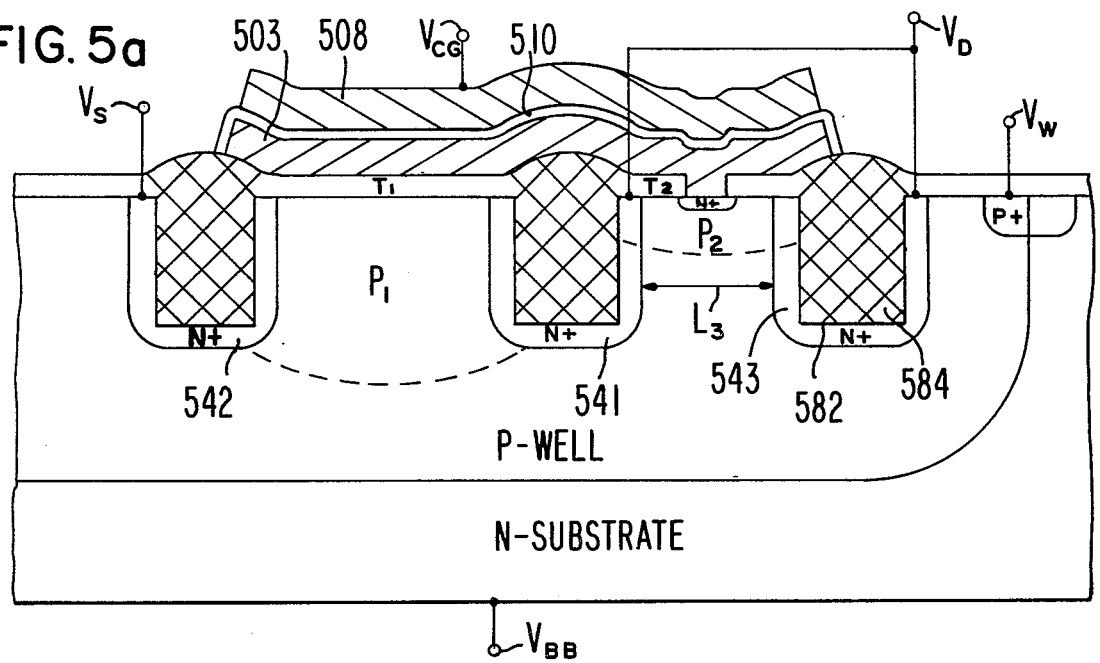
FIGS. 5a and 5b illustrate DRAM embodiments with vertical JFET formed by deep groove anistropic etching and isotropic etching of a P epi layer, respectively.

For the JFET to be an effective switch its channel diameter L3 should not exceed approximately 4 to 5 microns, dictating therefore that L2 and L4 each not exceed approximately 1.5 microns. Other structures are possible which result in very effective JFETs, however, at the expense of more complex processing. Two such cells are shown in cross section in FIGS. 5a and 5b. In the cell of FIG. 5a the deep N+ diffusions 541, 543 and 542 forming the source/drains of T1 and T2 as well as the gate of the aperture JFET are formed by anisotropic (vertical) etching of the silicon in deep grooves 582, then doping the walls of the grooves N+ and backfilling with deposited or grown oxide 584 or another such insulator. In all other respect the cell is same as that of FIG. 4.

Figure 5B:
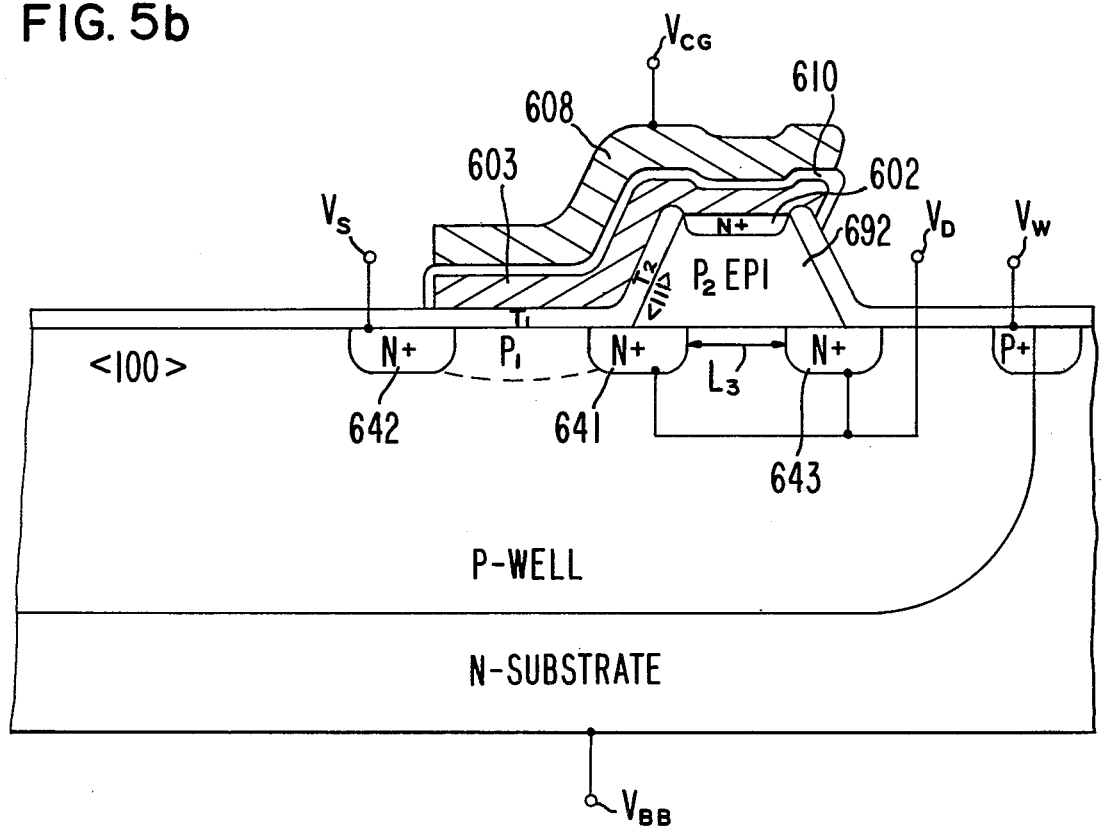

The cell of FIG. 5b is a more dense cell and provides an effective small area JFET (L3) yet without the need for diffusions 641, 642 and 643 to be deep. As in prior cells the circular drain aperture of radius L3 is surrounded by the N+ diffusion serving as gate of the orifice between the p-well (JFET) source and the P2-doped epi mesa structure 692 (JFET drain). The mesa is formed by first growing a p-epi of thickness 1.5 to 2.5 microns, then masking and etching along the [111] crystallographic plane (KOH) as well as several other chemical etchants are used for similar purposes in VMOS type devices). The write "0" transistor T2 is now formed along the [111] edge of the etched epi, while the read transistor T1 is formed as previously along the [100] surface. In all other respects, this cell operates the same as the cell of FIG. 4, yet it suffers far less from any deep junction effects such as bipolar latchup, or bulk punchthrough.

It is clear from the above description that there are numerous other process variations resulting in somewhat different cells, but with much the same principles of operation.

Figure 6A:
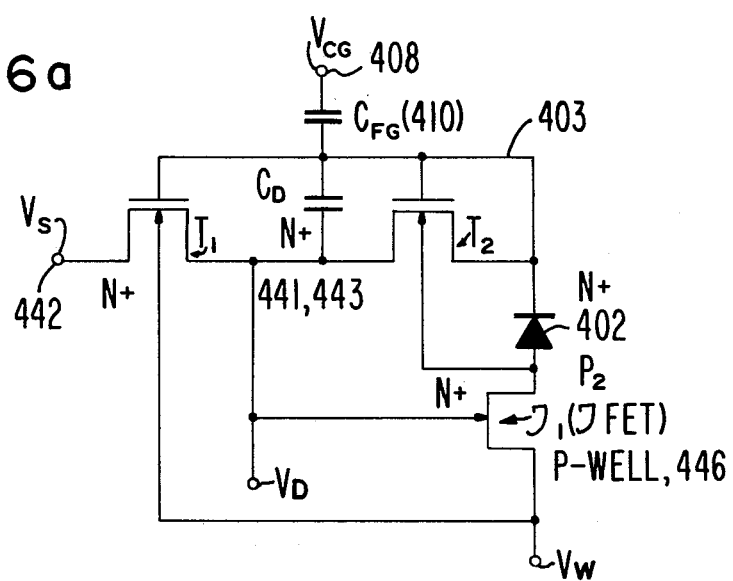
FIG. 6a shows the electrical equivalent circuit of the DRAM cell with vertical drain JFET shown in FIG. 5.

The electrical equivalent circuit of the drain JFET DRAM cell of FIG. 4 is shown in FIG. 6a. J1 is the vertical JFET controlling access from the p-well 446 to each cell's storage gate 403. Note that J1 also controls the substrate potential of transistor T2, which implies that this transistor has a floating substrate when J1 is in pinchoff.

Soft Error Protection

One key advantage of the drain JFET (other than the flexibility to write "1" by bit) is that under the pinchoff condition, which holds true for most of the cells in an array for most times (including standby, where all drains are at 5 V while Vw is at 2.5 V), the storage gates are practically completely immune from upset by incident high energy particles. Any charge generated in the bulk or close to the diffusions 441, 443 cannot be collected at the N+p storage node 402. Even the cell 100 of FIG. 1a, by virtue of the field distribution surrounding drains 141, 143, even if these are relatively shallow diffusions, will still be practically immune from any upset by alpha particle hits. This is a highly desireable feature which cannot be achieved with any prior art DRAM devices. Prior art DRAMs also suffer from sensitivity to soft error upset because of the 50-100 millivolt signal level which the sense amplifiers must detect. With the new DRAM cell the signal level provided by transistor T1 in its two threshold states is equivalent to approximately a 1.0 to 1.5 volts signal, rendering the probability of soft error upset during read almost non-existent.

3. Cell With Storage Node Junction Partially Bounded by Field Isolation

It has been pointed out that the virtual ground array of the DRAM implementation requires an N+ drain diffusion on either side of the N+p junction 102 of the storage gate. Thus, diffusion 141 (FIG. 1a) isolates between channels L1 and L2 of the same cell while diffusion 143 isolates between channel L2 of the cell and channel L1 of the cell to the right. Because of the circuit design complexity associated with the virtual ground array, it may be desireable to construct an array where each two cells share a common source diffusion about which they are mirror-imaged. Two such cells (called, from here on "shared source cell") are shown in cross section in FIG. 7a and in top view in FIG. 7b. Cell 700 has drain diffusion 741 underlying and running perpendicular to the storage gate 703 and the control gate 708. These two gates are isolated by thin dielectric layer 710, and the storage gate is isolated from the p-well 706 through the N+p junction 702, which in this embodiment may abutt on one side to a field isolation oxide 756 (formed in a well know manner). This isolation separates junction 702 from the equivalent junction 702a of the cell to the right. Therefore, the field isolation serves a similar function to the drain diffusion 143 of cell 100 (FIG. 1a) and occupies approximately the same area. N+ diffusion 742 is the source, which runs parallel to the drain diffusion (FIG. 7b), and is shared by the two cells immediately to its left and right, which are mirror imaged about the source. Transistors T1 (read) and T2 (write "0") serve the same purpose as in cell 100, and all device operations are identical with the exception of read, which is simpler to implement than the read for the virtual ground array of FIG. 1b.

As can be seen from top view (FIG. 7b) the region of junction formation 702 can be formed to be self-aligned to the field oxide 756 or 750 on one of its sides, and by a self-aligned channel-stop isolation 712 defined in the non-active areas by the etched edges 711 of the first and second gates. [The field oxide isolation can also be made to surround junction 702 from three out of four sides (shown in FIG. 9d), with the fourth side forming transistor T2 to drain diffusion 741.] Normally the gate oxide 771 is opened at 702 with a buried contact mask prior to deposition of the storage gate 703. Channel implants P1 and P2 of transistors T1 and T2 respectively are usually performed at this stage too (i.e., prior to deposition of storage gate). The region 712 of exposed silicon must be protected from N+ doping or else it will short the N+p junctions of adjacent cells in a column. This is achieved either by leaving oxide in regions 712 during the buried contact masking or by oxidizing 712 after etching the gate 703 and only then N+ doping the gate (the gate is, in one embodiment, protected with a thin silicon nitride layer during oxidation of the channel-stop region 712). The N+P junction 702 is formed when the dopant (phosphorus or arsenic) is driven out of gate 703 into the p-well 706 during subsequent heat treatments. A very shallow junction (2000-3000 Å) can be formed with arsenic as the dopant and with a relatively low temperature back-end process. Alternatively the N+P junction 702 can be formed by doping the silicon underneath the buried contact oxide opening at the same time that N+ diffusions 741, 742, 746 are formed.

Because the drain diffusion 741 does not completely surround junction 702 and also because of the heavy P doping 755 encroaching into 702 from the oxide field region, this cell cannot operate in the drain JFET mode of the cell in FIG. 4. However, the increased junction storage capacitance due to the boron encroachment from region 755 to junction 702 as well as the boron encroachment from the channel stop region 712 to junction 702, and the partial shielding effect of the space charge region formed around the adjacent drain diffusion 741, all but assure immunity to upset by alpha-particle hits. This protection is further enhanced by the P-well in N-substrate or P-well in N-epi, since most of the charge generated in the bulk by an alpha particle never makes it back into the P-well.

As with the virtual ground embodiment in this embodiment all column diffusions 741, 746 and shared source diffusions 742 in an array can be contacted through openings (vias) in the passivation layer. Metal lines running parallel to the column diffusions can be used to lower the column impedance associated with the N+ diffusions.

Shared-Source Cell In A Memory Circuit

Figure 8:
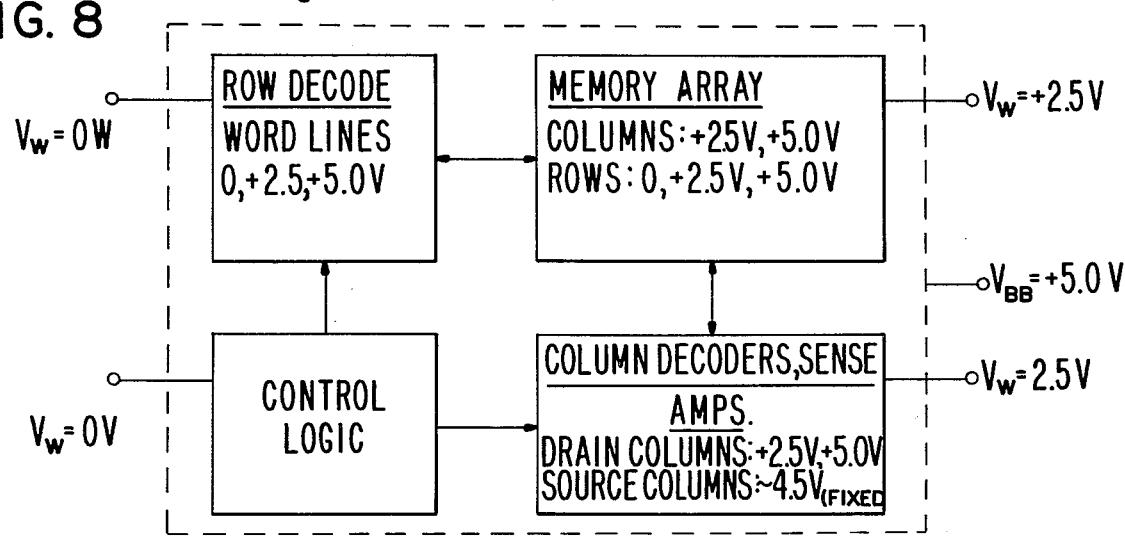
FIG. 8 is a DRAM block circuit schematic, showing voltages required on different P-wells.

We will now describe in broad terms the implementation of the shared-source cell 700 in a high density DRAM circuit, operating from a 0, +5 V supply (similar operation applies for a circuit having 0, +5 V and −5 V supplies). The different circuit blocks required to properly operate the DRAM in all its modes are shown in FIG. 8, including the respective potentials applied to the isolated P-wells. The control decoding, level shifting and amplification can all be performed either with CMOS or with NMOS periphery circuitry.

Contrary to the virtual ground approach where each drain column is also used as a source and therefore must be capable of switching its voltage levels, the shared source column of each two cells serves as source alone and therefore can be held at a fixed voltage, usually between +2.5 volts and +4.8 volts. This voltage is enough to provide adequate source-drain read current, yet sufficiently close to +5.0 V to ensure that during read the drain 741 of a transistor in its "1" (conducting state) does not drop below approximately 4.5 V when its sense-amp is latched into the low state (if the drain 741 drops too much below 4.5 V its transistor T2 may be turned on weakly, initiating a "read disturb" condition as described in a previous section). For the same reason it may be necessary to provide additional clamping circuits on each drain column to prevent it from going below +4.5 V during read. The actual voltage on the source 742 can be chosen such that during read, transistor T1 of the accessed cell is either conducting (state "1") or totally off (state "0"). That is, with a fixed read voltage (+5.0 V) on the control gate the source voltage can be raised or lowered just so that it sets T1 to have a threshold intermediate between the thresholds for the two storage states. It is clear from the above discussion that cell 700 can also be implemented with a split gate for read transistor T1, much like the cell of FIG. 3.

The clocking sequence required for a read/refresh operation in the shared-source array of FIG. 7b is as follows. The correct clocking for read, write "1" and write "0" is same as shown in FIG. 2 with the addition of a fixed voltage on all sources. Each bit on the accessed row is first read, latching its sense amp connected to the cell's drain at the bottom of the column (each pair of cells sharing a common source have two sense amps). All cells in the row are then written "1". Then the cells previously in the "0" state are written back into that state (leaving all other cells in the row in state "1") using the data latched at each sense amp. To rewrite the correct state back into each accessed cell it is necessary to actually invert the signal on the sense amps. For example, if the cell is initially in state "0" (non-conducting) the read operation will cause the sense amp to latch in the high (+5 V) state; yet to rewrite a "0" the drain diffusion must be set low (at +2.5 V) during write "0". Therefore, provision must be made to invert the sense amp data presented to the columns at the appropriate time in the refresh cycle.

Multiple Level Storage

Figure 6B:
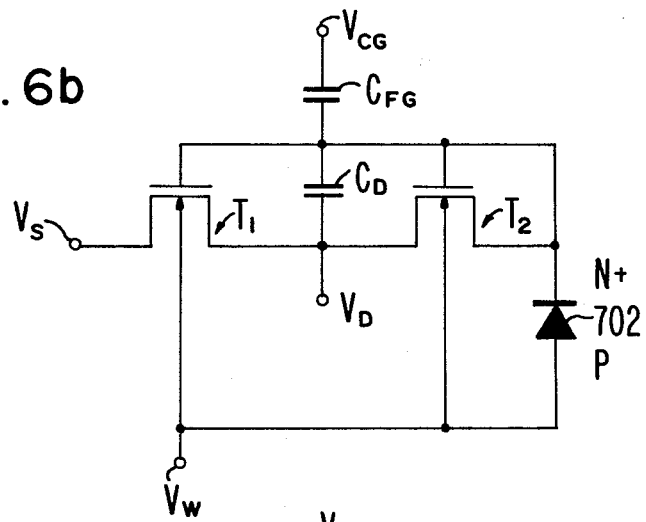
FIG. 6b shows the electrical equivalent circuit of the DRAM cell shown in FIGS. 7a and 7b.

Multiple level storage can be achieved as described earlier by varying the potential on the drain diffusion 741, which is capacitively coupled through $C_D$ (FIG. 6b) to the storage gate 703 through the gate oxide 771, during the write "1" operation. This effect influences the value of $\Delta Qh$ and can therefore result in different state "1" thresholds for different drain voltages.

The same drain coupling effect can also be used to advantage in designing a reference cell to be used in the sense amplifier reference arm. This reference cell can be made to have a level "1" threshold which is intermediate between the "1" and "0" states of the memory cell. This can be done simply by changing the cross section area of the N+ diffusion 741 of the reference cell, thereby increasing the coupling capacitance $C_{Dref}$ between storage gate and drain of the reference cell. This increased capacitance is translated during write "1" into a smaller value of $\Delta Qh$ and therefore a less positive threshold for state "1" of the reference cell. Alternatively, an intermediate "1" threshold on a reference cell can be achieved by placing +2.5 V on all memory cell drains during the write "1" while placing +5.0 V on the drain of the reference cell during the same write "1" cycle and keeping the cross section area of diffusion 741 the same for both memory and reference cells.

It is also possible to use the two values of the "1" state as the "0" and "1" storage states, with the reference cell then having another intermediate value of threshold between these two "1" states. This has the advantage for circuit design in that "read refresh" becomes a single cycle operation viz. first read to latch all sense amps, then write "0" or "1" simultaneously by charge pumping holes for the selected row with each column either at +2.5 V (refresh "1") or at +5.0 V (refresh "0"). The need for T2 for write "0" is therefore eliminated in this scheme. By contrast the scheme described previously for "read refresh" requires two write cycles: first all cells in the selected row are written "1", then the read data stored on the sense amps is used to selectively write "0" on selected cells only.

Clearly, the relatively large storage window between the "0" and "1" states provides the ability to develop dynamic multi-level storage, limited only by the ingenuity of the circuit designer and his ability to design multi-level sense amplifiers/refreshers. Multi level storage is advantageous because of the greatly enhanced storage density it provides. In prior art CCD memories where attempts were made to achieve multi-level storage the prime difficulty revolved around the inability to readily generate on chip more than one reference level required for detecting multiple storage states. In the present invention the ready availability of multiple well-controlled reference levels generated by changing $C_{Dref}$ through the geometrical gate to drain overlap area in reference cells makes multilevel detection a relatively simple task. Each column in the array would be connected to the input node of several sense amplifiers, each having a slightly different reference cell. For example, if a 4 level storage (0,1,2,3) was to be implemented at each cell then each column would be connected to the input nodes of three sense amplifiers having three difference reference cells such that the first sense amp is able to distinguish between levels 0 and 1, the second one is able to distinguish between levels 1 and 2, and the third between levels 2 and 3. Of course this is only one of several other circuit design techniques which can be used in conjunction with multilevel storage in the present invention.

4. Cell With Write Transistor Directly Controlled by Control Gate

Figure 6C:
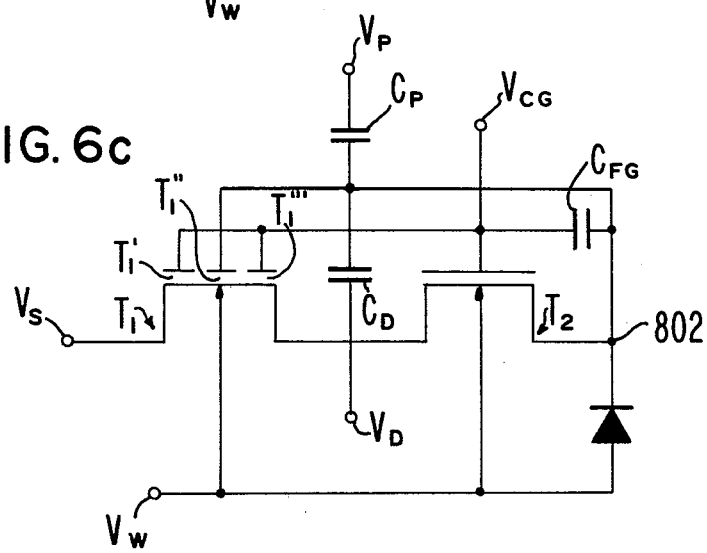
FIG. 6c shows the electrical equivalent circuit of the DRAM cell shown in FIGS. 7c and 7d.
Figure 7C:
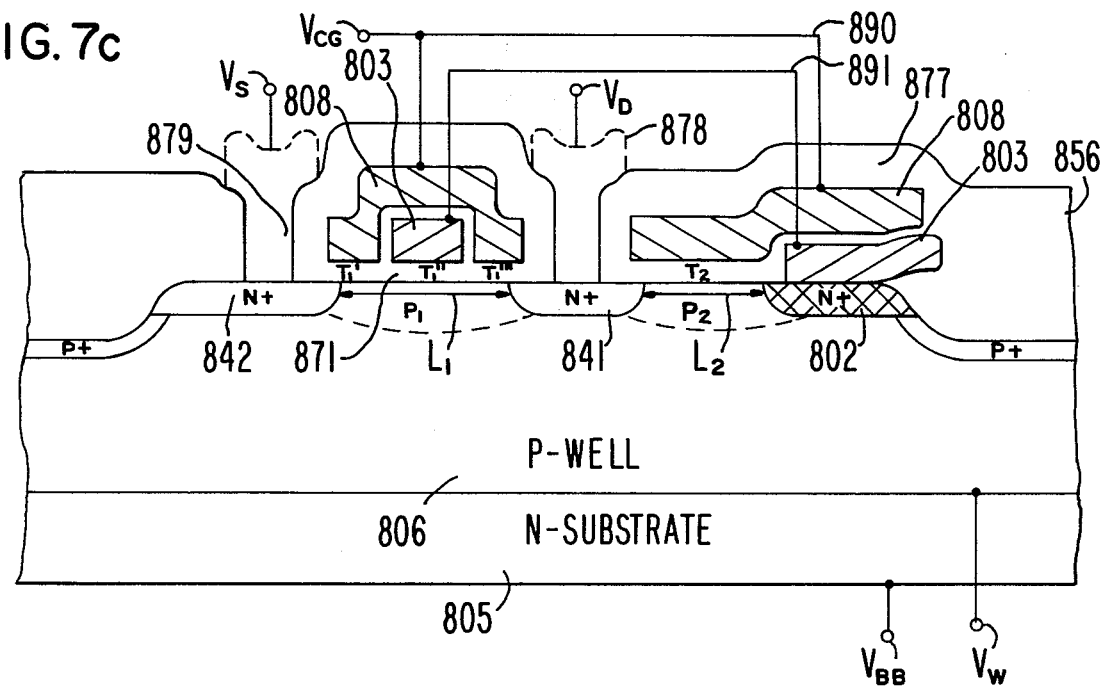
FIG. 7c illustrates along cross-section 7c—7c of FIG. 7d a DRAM embodiment where access to the storage junction is controlled directly by the control gate extending over the entire channel length of the write transistor.

Prior embodiments of this invention have their T2 write transistor controlled by the junction isolated gate 703 (FIG. 7a) which in turn is tightly coupled to the control gate 708. In the embodiment of FIG. 7c, transistor T2 is controlled only by the control gate. An example of a single cell of this embodiment is shown in FIG. 7c in cross section along AA' and in FIG. 7d in top view showing AA'. A circuit schematic of this cell is shown in FIG. 6c.

In this cell the first gate 803 makes a buried contact junction 802 with the P-well 806 diffused or otherwise formed into an N substrate 805. In one embodiment the gate 803 extends over part T1 of the channel length L1 of the read transistor with N+ source 842 and drain 841. The remaining portions T1' and T'" (which can also be combined into a single portion by shifting T1" towards the source or drain edge) of channel L1 are controlled directly by the control gate 808, which also controls all of the channel L2 of write transistor T2. In other derivatives of this cell T1" can constitute the entire extent of channel length L1. Channel doping concentrations P1 and P2 can be established independently to give different threshold voltages $V_{T1}$ and $V_{T2}$ (gate oxide thickness 871 is approximately the same for T1', T1" and T1''' so that to a first approximation $V_{T1} = V_{T1'} = V_{T1''} = V_{T1'''}$). N+ drain diffusion 841, source diffusion 842 and buried junction diffusion 802 serve to define the two transistor channel lengths L1 and L2. Vias 879 and 881 through passivation layer 876 are used to connect metallic conductors 877 and 878 to source 842 and drain 841 diffusions.

Figure 7D:
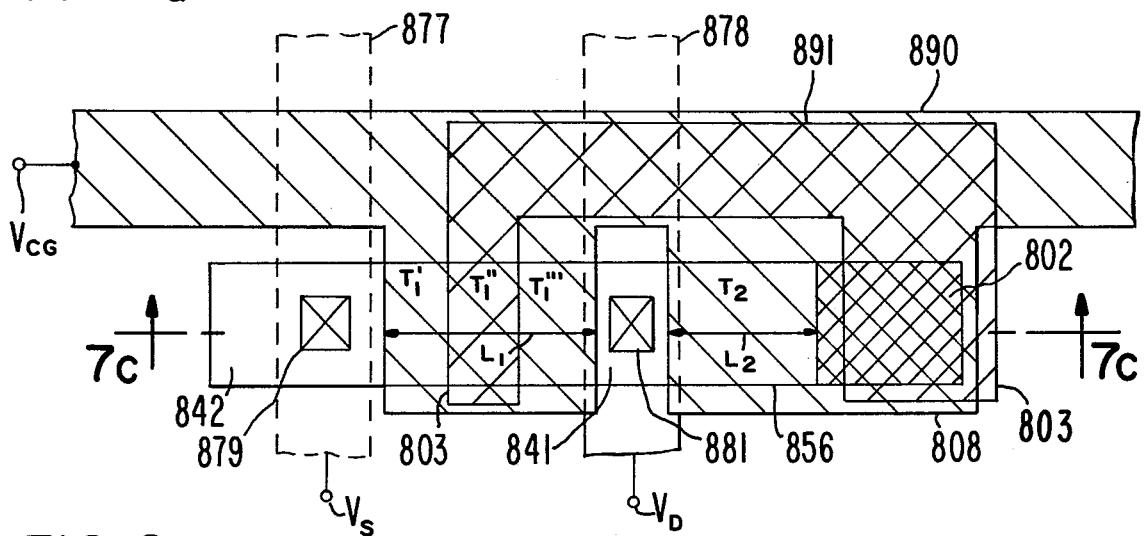
FIG. 7d shows in top view the cell of FIG. 7c.

The topological layout shown in FIG. 7d is of course by no means unique. For example, transistor T2 and buried contact junction 082 can equally well be laid out perpendicular to the read channel direction L1, occupying the area underneath the metal interconnect 878 for a more compact cell.

The cell in this embodiment can be operated in one of two modes of operation. The first is the same as for all the embodiments previously described in this invention, using charge pumping to inject net positive charge from the P-well onto the junction-isolated gate 803 (state "1") and using injection of electrons from the drain diffusion 841 through transistor channel T2 onto gate 803 to store the low conduction state ("0").

There is also a second mode of operation for programming which eliminates the need for charge pumping from the P-well 806. This in turn eliminates the need for a negative pulse applied to control gate 808 or for that matter the need for the array to be constructed within a P-well. In this second mode, the entire memory array can be fabricated on the same P-type substrate as that for the peripheral circuitry. Also eliminated is the need for strong capacitive coupling between control gate 808 and storage gate 803. Instead it is required that the storage gate 803 be strongly capacitively coupled through capacitor Cp to a fixed voltage Vp (typically Vp can be one of the two supply voltages). Capacitor Cp and node Vp are not shown in FIGS. 7c or 7d but are shown in FIG. 6c. Cp can be formed in one of several ways, for example, by the area of overlap between gate 803 of the accessed cell and control gate 808 of an adjacent word line (which is always at 0 V during the time the accessed cell is written or read), or by using a buried diffusion or a third level of interconnect to provide the field plate Vp. The amount of charge Q stored on gate 803 is directly proportional to the relative values of the major capacitances Cp, CD and CFG and voltages Vp, $V_D$, $V_{CG}$ and Vw shown in FIG. 6c. Reading is essentially the same as for all previous embodiments with the charge stored on storage gate 803 determining the conduction state of part or all of the channel of the read transistor T1". In the embodiment where T1" is in series with the control gate sections T1' and T1''', then reading also requires that the control gate 808 is brought to a voltage higher than $V_{T1'}$ and $V_{T1'''}$ during read. A typical set of thresholds can be $V_{T1'} = V_{T1''} = V_{T1'''} = +0.7$ volts.

To write the high conduction state ("1") drain 841 is raised to +5 V, followed by control gate 808. This turns on transistor T2 whose source 802 is pulled up to $\sim 5.0 - V_{T2} \cong +4.0$ V (the source-body effect raises $V_{T2}$ to $\cong 1.0$ V). Control gate 808 is then brought back to 0 V shutting off the storage gate 803 from the drain voltage. Capacitor Cp and the reverse biased junction between region 802 and well 806 ensure that the charge Q remains stored on gate 803 for a period of a few milliseconds at room temperature. The substrate bias Vw can be set at between 0 V and −3.0 V, which can be generated on chip off the +5.0 V supply.

To write the low conduction state ("0") drain 841 voltage is kept at 0 V while control gate 808 is pulsed to +5 V. This discharges node 802 and the storage gate 803 to 0 V through T2. In an M by N memory array all N cells along an accessed row having a common control gate 808 (word line) are written simultaneously into "1" or "0" states depending on having +5 V or 0 V respectively on their drain diffusions (bit lines) when their word line is momentarily brought from 0 V to +5 V. Bit line voltages are established by sense amplifiers at the end of each bit line. All unselected (M-1) rows in the array have 0 V on their word lines keeping their write and read transistors off to prevent program disturb and reduce power dissipation. To further reduce power dissipation the source diffusions 842 running parallel to the bit line diffusions 841 can be set at +5 V during programming, or they can be floated. In a virtual ground array these source diffusions constitute the drains of adjacent bit lines.

Between read, write, or refresh intervals all control gates in the array are set at 0 V, shutting off all T2 transistors, thereby eliminating leakage paths for charge stored on gates 803. All drain diffusions are kept at +5 V during standby to act as effective collectors of substrate charge generated near the surface by incident high energy particles, thereby increasing immunity to memory state upset. Refresh is required every few milliseconds, as with all other dynamic RAMS. Multiple level storage is also possible with this cell, where the various conduction states of read transistor T1" are determined by the voltages $V_{CG}$ on control gate 808 and drain $V_D$ 841 during the programming operation. Reading is performed simultaneously for all n cells on an accessed word line, either by current sensing through read transistor T1" or by sensing the rate of voltage drop on the bit line drain diffusion, which may be set at a voltage between +2.0 and +5.0 volts prior to onset of the read cycle. The selected word line is brought from 0 V to approximately +2.0 V, which is sufficiently high to turn on series read transistors T1' and T1''', yet is lower than $V_{T2}$ (if $V_{T2}$ is fabricated with higher threshold than $V_{T1}$) so as to prevent a "read disturb" condition where the charge on storage gate 803 may be either enhanced or decreased through write transistor T2. Alternatively, if $V_{T1} = V_{T2} \approx +0.7$ V then the read operation will slightly disturb the "0" state, but there will still be approximately a 3 volts potential difference on gate 803 for the "0" and "1" states. Conduction between drain 841 and source 842 then depends on the state of charge stored on gate 803, which controls the series read transistor T1".

A read cycle must precede each write and refresh cycle to set all sense amplifers into their correct states.

Processing of the cell of this embodiment uses the same technology as described previously for other embodiments, with N+ source 842, drain 841 and junction 802 diffusions formed prior to formation of the first and second gates 803 and 808. Alternatively, a more conventional isoplanar self-aligned silicon gate process is employed where channel lengths L1 and L2 are defined by using the edges of control gate 808 to define the source and drain regions, as shown in the cell of FIGS. 7c, 7d. It is, in fact, possible to also reverse the order in which the two gates are formed: the control gate 808 can be formed in the first layer of polysilicon, which defines the channel length of the write transistor and part of the channel length of the read transistor. After forming dielectric isolation over this control gate a buried contact corresponding to 802 is opened adjacent to the edge of the write transistor and the second level polysilicon is defined to form the junction isolated storage gate 803 in contact with region 802. Gate 803 also extends up beside and over (but isolated from) the control gate (which is over the channel of the write transistor) and then over the remaining portion of the channel length of the read transistor. Source and drain diffusions can then be formed by diffusion or ion implantation self aligned to the edges of both the first and second level gates. This reversal of first and second gates relative to the structure shown in FIG. 7c allows greater flexibility in formation of storage capacitor Cp which can, for example, be formed between the storage gate (which now overlies the control gate) and a third level of interconnect forming an overlapping field plate. For additional speed in access time and cycle time of the memory array, it is advisable to lower the sheet resistivity of the word line 808, which can be achieved by forming it out of a refractory metal or a silicide of polysilicon. The bit line diffusion resistance is low because of periodic contacting by the metal lines running parallel to the bit lines.

Scalability

One major problem with prior art "one transistor and one capacitor" dynamic RAM cells is that as the cell becomes smaller and the array density greater the stored signal decreases while the column diffusion capacitance either increases or remains unchanged. Therefore, the signal level available to the sense amplifiers becomes even smaller, pushing the device close to the manufacturing-limited tolerances, increasing the sensitivity to soft errors and decreasing the signal to noise ratio. Consequently it is questionable if today's technology can economically manufacture dynamic RAMs to density above the 256 K bit level. With the cell of the present invention in any of its embodiments the signal level available to the sense amplifier can be maintained at approximately one volt regardless of the size of the cell, so long as transistors T1 and T2 are properly scaled to assure proper threshold control. Therefore the device has no upper limit imposed on the maximum array size which can be manufactured economically. For example, using present generation processes and design rules a shared source cell occupies 100 to 150 microns$^2$, and has a $\Delta V_T = V_{T"1"} - V_{T"0"} \approx 1$ volt. Using improved lithography (such as 10 to 1 step and repeat projection aligners) can result in a cell of area 40 to 80 square microns, still with the same $\Delta V_T \approx 1$ volt. Using even higher resolution lithography (direct write E-beam or X-rays) yields, with proper scaling of the various films, a cell of area 10 to 20 square microns, again with the same $\Delta V_T \approx 1$ volt. To economically manufacture a 256K bit dynamic RAM a cell of area ~70-90 microns$^2$ is required, while an area of 15 to 25 microns$^2$ is required for an economical 1 megabit memory chip. The new cell clearly is limited only by the ability to reproducibly define and etch with high resolution, there being no other electrical, fundamental (material related) or circuit design limitation on its scalability to ever smaller cells in ever higher density memory arrays. In generalized terms the area of the new cell expressed in terms of the minimum feature size used in the process, F, is approximately 10F$^2$ to 12F$^2$. This compares with approximately 20F$^2$ for cells used in commercially available 64K bit dynamic RAMs (e.g. for a minimum feature size F=3.0 microns the typical cell size is 180 microns$^2$).

Processing Considerations

The basic process flow for fabricating the various embodiments of the new DRAM cell closely follows standard NMOS or CMOS processes with double polysilicon construction. It is similar, for example, to processes for fabricating EPROM structures where strong coupling is required between a floating polysilicon gate and a control gate. As with EPROM structures, the first and second polysilicon levels can be etched in the same step so as to result in self-aligned edges. Contrary to EPROM, however, the dielectric 110 between first and second gate can be made very thin (less than 500 Å) to enhance the coupling, and in fact, need not even be of a very high dielectric integrity. This is because the voltage drop between control gate 108 and storage gate 103 is usually in the range 0 to 2.5 volts, as compared to 20 to 25 V in EPROM devices. Also, leakage in this dielectric need not have the catastrophic effect it will have in an EPROM because the DRAM cell is being refreshed once every several milliseconds, and the stored signal $\Delta Q_h$ is sufficiently large to take more than several milliseconds to degrade through leakage in the dielectric.

Key deviations from the standard process revolve around formation of the source/drain diffusions 141, 142 and 143 since these can be formed prior to deposition of the first and second gates. By contrast, the prior-art, self-aligned silicon gate process has N+ source/drain diffusions formed after definition of the polysilicon gate, and no diffusion is allowed to cross under a polysilicon strip.

A second deviation from standard processing occurs in the formation of transistor T2 which has its N+ drain diffusion 102 formed by out diffusion from the polysilicon gate 103. This is similar to the manner in which depletion load NMOS devices are constructed, using a buried contact opening in the gate oxide 171 to establish direct electrical contact between the polysilicon 103 and the P-substrate (or P-well) 106.

For high density memory arrays it is important that channel length L2 of transistor T2 be relatively small (1.0 to 2.0 microns) yet be relatively well controlled. This can be achieved either by using advanced lithographic equipment such as 10:1 step and repeat projection aligners which have layer to layer registration accuracy of better than ±0.5 microns. It can also be achieved by defining L2 in the same diffusion step which defines L1—the channel length of the read transistor T1. This is particularly easy to do in conjunction with the shared-source cell shown in FIGS. 7a and 7b. In this case storage junction 702 is formed with an N+ diffusion of the same doping profile as the source/drain diffusions 741,742.

A third deviation from standard processing occurs in the formation of channel stop isolation between adjacent devices in a memory array. Although the array can be implemented using standard isoplanar (i.e. recessed oxide) isolation, its area can be significantly compacted by using channel stop isolation which is self-aligned to the control gate (word line). In one embodiment, the N+ drain diffusion surrounds the storage junction and thereby forms electrical isolation from all adjacent cells.

A third technique, useful particularly for formation of the circular drain aperture JFET of the cell of FIG. 4 relies on controlled chemical undercutting of layers of masking films to first define drain diffusion regions 441,443 (FIG. 4) to be doped N+, then, by overetching inwards defining the parameters L2 and L4 (the value of L4 need not be accurately controlled so long as there is a good electrical contact between gate 403 and P-well 406).

There follows a description of the process flow required to manufacture a memory array using the shared source cell of FIGS. 7a, 7b, with partial isoplanar isolation (750,756) between adjacent cells sharing a common word line and with channel stop isolation 712 self aligned to the word line to provide isolation between adjacent cells sharing a common column drain or source diffusion.

Process Flow for Shared-Source Cell

In this embodiment the process begins with an N-type silicon substrate 705 of approximately ten ohm-centimeters resistivity and with [100] crystallographic orientation. Into this substrate p-well regions 706 are formed by first masking and then ion implanting boron in the range of $1 \times 10^{12}$ Cm$^{-2}$ to $5 \times 10^{13}$ Cm$^{-2}$, then thermally driving the implanted specie to a depth typically between 3 microns and 10 microns. It is also possible to first p+ dope the N substrate with a heavy implant of boron (approximately $1 \times 10^{15}$ Cm$^{-2}$ to $5 \times 10^{15}$ Cm$^{-2}$) in the regions where p-wells are to be formed, then growing a lightly N-type epitaxial layer of thickness between 2 microns and 10 microns, then performing the p-well formation steps. This approach significantly reduces the lateral impedance in the p-well, which may be an important consideration for SCR latchup protection and noise immunity in the circuit. During these steps it is important that the process allows formation of visible steps on the surface so that subsequent layers can be properly aligned to the p-well regions.

Figure 9A:
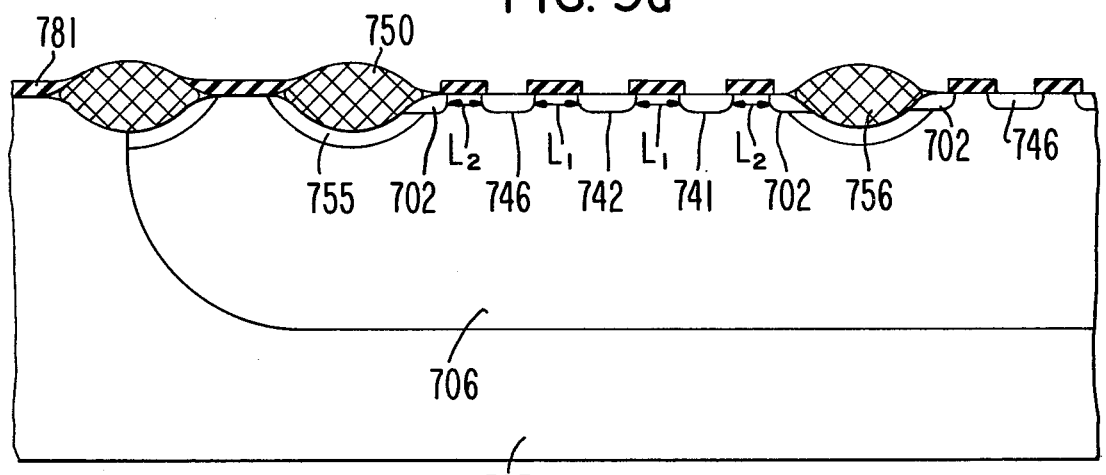
FIGS. 9a through 9e show two embodiments of the shared-source cell in various stages of their manufacturing flow with the key difference between the two embodiments lying in the formation of the field isolation.

The next step is to form isoplanar oxide isolation regions 750, 756, both within each p-well as well as isolating between adjacent p-wells. These regions are formed using methods well known to those skilled in the art. A thin layer of thermal silicon dioxide is covered with a thin layer of silicon nitride. Masking and a selected etchant (well-known in the art) is used to etch the silicon nitride from regions where isoplanar oxidation is required. Next, the isolation regions are implanted with boron 755 to approximately $1 \times 10^{13}$ Cm$^{-2}$, followed by a prolonged oxidation to form field oxide 756 to a thickness varying between 4000 Å and 10,000 Å (depending on field inversion voltage required for proper operation). Next, the masking silicon nitride and thin silicon dioxide are etched back. A masking oxide is then grown or is deposited. Windows are opened in this oxide through to the underlying substrate in the form of long strips for column diffusions 741, 742, 746 and in the form of small squares or rectangles, one square per cell in the region 702 where the storage junction is to be formed. The spacing between each square and the adjacent long strip will eventually determine channel length L2 of the write transistor T2, while spacing between adjacent long strips will determine channel length L1 of the read transistor T1. Shallow N+ diffusions are formed in the areas of silicon surface exposed by the openings in the masking oxide, usually by ion implantation of arsenic to a dose of $5 \times 10$ cm$^{-2}$ or by diffusion or a spin-on dopant containing arsenic. The memory cell is shown in cross-section in FIG. 9a after a thermal drive-in cycle prior to stripping of the masking oxide. Regions 702, 741, 742 and 746 have been diffused into P well 706. The same N+ diffusion formation cycle can be used in the periphery to form interconnects or to tie the substrate 705 potential, as shown by diffusion 781 (FIG. 9a). At the completion of all high temperature cycles in the process the N+ junction depth is less than approximately 0.5 microns. After dip-etching the masking oxide selected areas in the periphery are masked and the surface is implanted with a light dose ($1 \times 10^{11}$ cm$^{-2}$ to $1 \times 10^{12}$ cm$^{-2}$) of phosphorus or arsenic to form depletion-threshold transistors. Similarly light boron implants ($1 \times 10^{11}$ Cm$^{-2}$ to $3 \times 10^{12}$ Cm$^{-2}$) can be implanted selectively through photoresist masks at this stage to form regions P1 and P2 (P1 may be the same as P2, and both may also be the same as the enhancement threshold used in periphery (non-memory) transistors) shown in FIG. 7a.

Next, a gate oxide 771 is thermally grown to a thickness in the range of 250 Å to 750 Å (depending on the required threshold voltage for transistors T1 and T2). In case of autodoping of the exposed channel L1, L2 from the heavily N+ doped regions 741, 742, 746 and 702 it is desirable to grow part of the gate oxide prior to implantation of the N+ diffusions, and then complete the oxidation after the arsenic has been implanted through the partially grown gate oxide. Similarly boron implants to form regions P1 or P2 can both be implemented after formation of the gate oxide rather than before this oxidation. This minimizes the extent of redistribution of boron during gate oxide formation.

Next a masking step is used to define and etch openings in the gate oxide, commonly known as buried contacts. Each cell has a single buried contact opening located so as to allow electrical access to the N+ junction 702. The buried contact mask can be allowed to have some degree of misalignment with respect to field oxide 756 or N+ junction 702 so long as adequate electrical contact can be established to 702. Because the field oxide 756 is so much thicker than gate oxide 771 the buried contact etching can be performed to completion without significantly reducing the thickness of the field oxide.

Next, a layer of polysilicon is deposited in a CVD reactor to a thickness in the range between 2000 Å and 4000 Å. This polysilicon can be N+ doped in-situ or can be doped subsequent to deposition by diffusion or ion implantation. Because it is not intended for use as a long conductor in the circuit, it need not have a low sheet resistance; typically 100 ohms per square is quite adequate. It is important that diffusion of the N+ specie through the polysilicon and into the silicon through the buried contact openings in gate oxide 771 not be allowed to form too deep a junction at 702.

The polysilicon 703 is next masked and etched using conventional techniques to form a plurality of strips, each strip spanning channels L1, L2 and being parallel to and directly over diffusions 741, 746.

Figure 9B:
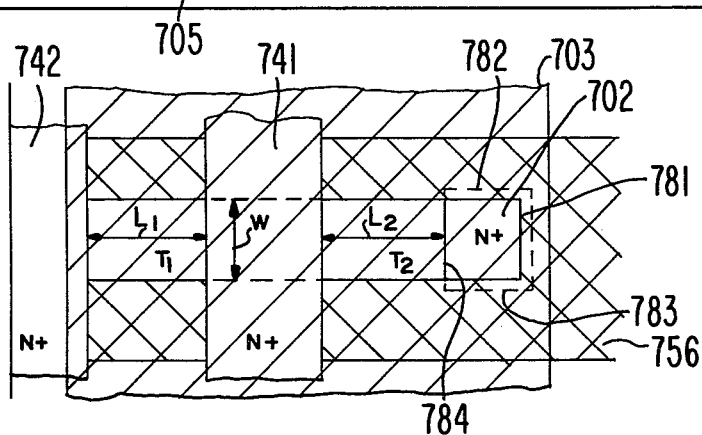
Figure 9C:
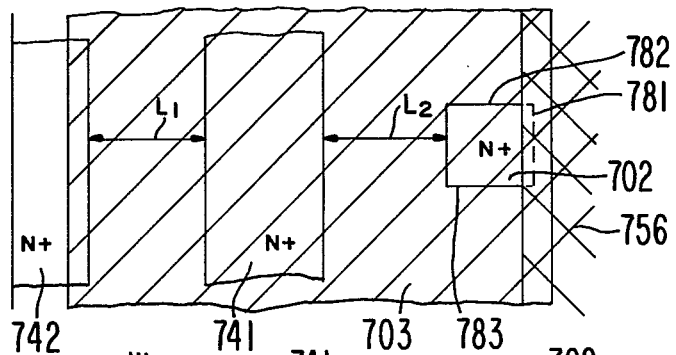

A top view of a single cell in two slightly different embodiments is shown at this stage of the process in FIGS. 9b and 9c, where the difference is in the extent to which the field oxide 756 is allowed to define the channel width of transistors T1 and T2 and the area of junction 702: In the cell of FIG. 9b the field oxide defines three (781, 782, 783) out of four sides of this junction, while in the cell of FIG. 9c it defines only one side 781 of this junction, and in addition, it is not used to define the active channel width of transistors T1 and T2.

Proceeding with the process sequence, the N+ polysilicon is now thermally oxidized to form an oxide to a thickness in the range of 200 Å to 900 Å. This film may be further capped with a CVD film of silicon nitride of thickness in the range 200 Å to 1000 Å. The purpose of the single or dual dielectric 710 is to provide electrical isolation between the polysilicon layer 703 and a second conductor 708 forming the control gate. The thickness of the single or dual dielectric determines the extent of coupling $C_{FG}$ between control gate and storage gate, which preferably should be a relatively large component ($\geq 50\%$) of CTot (the total capacitive coupling between the storage gate and the structure). Alternatively, insulation 710 can consist of thermal silicon nitride formed in a wellknown manner by flowing ammonia over the surface of the polycrystalline silicon at a temperature in the range of 1000° C. to 1100° C. in the absence of oxygen.

Figure 9D:
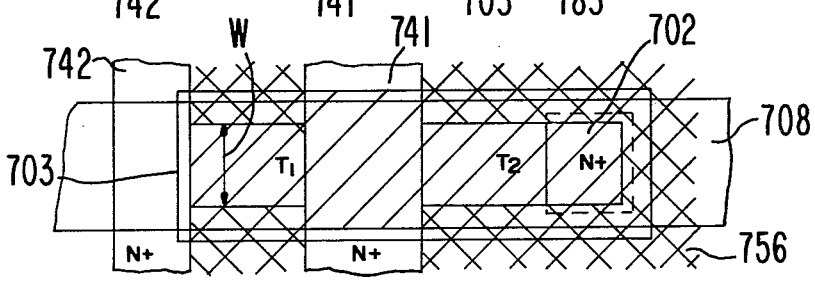
Figure 9E:
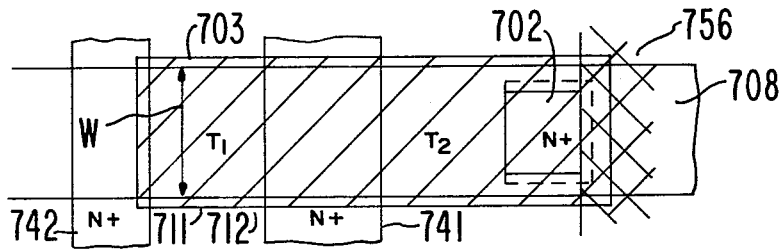

Following the formation of dielectric 710, a second conductive layer 708 is deposited. This layer can be polysilicon or some form of a low resistivity silicide or refractory metal which can withstand subsequent oxidation. This layer, if polysilicon, is doped N+, then masked and etched to form strips running perpendicular to the previously formed polysilicon strips 703. The etching process is continued through the dielectric 710 and polysilicon strips 703 so as to expose the underlying gate oxide 771. It is important that strips 708 be properly aligned to completely cover the buried contact edges 782 and 783 (FIG. 9b). Otherwise the etching through polysilicon strip 703 will result in partially etching the substrate, which may degrade the leakage characteristics of storage junction 702. In the case of the embodiment of FIG. 9b, it is also important that any misalignment in formation of strips 708 still allows a small overlap of the field oxide defining the channel width W of transistors T1 and T2. In the cell of FIG. 9c, this is not an important consideration since the channel widths W of T1 and T2 are defined to be self-aligned to the edge 711 of first (703) or second (708) gates. At the completion of this step, the cell of FIG. 9b is shown in FIG. 9d, while the cell of FIG. 9c is shown in FIG. 9e. The cell of FIG. 9d is now essentially electrically completed while the cell of FIG. 9e still requires formation of channel stop isolation in regions 712 between adjacent cells and storage nodes 702 along the same column.

Channel stop isolation 712 is achieved by implanting boron to about one to five times $10^{13}$ Cm$^{-2}$. The boron implantation is automatically self-aligned to the complement area of the first and second polysilicon layers (703 and 708 respectively). The boron implant is at an energy sufficient to penetrate the gate oxide 771.

In the periphery, the field oxide 756 is used to define the channel width W of all transistors, and the second layer of polysilicon (or silicide) is used to define the gates of peripheral transistors. The N+ diffusions 741, 742 automatically overcompensate the boron in those areas in which regions 741 and 742 are exposed to the channel stop implant. Comparing the cells of FIG. 9d and FIG. 9e, it is evident that the channel stop isolation employed in the latter results in substantial reduction of cell size since it is not necessary to allow for misalignments of the second polysilicon level 708 to the field oxide as is the case for the cell of FIG. 9d. The tradeoff is in increased process complexity required to perform the self-aligned channel-stop isolation.

At this stage, masking is used to shield the array while forming self-aligned source/drain diffusions for peripheral transistors. These are shallow (less than 0.5 micron) junctions formed by ion implantation of arsenic through the exposed gate oxide using polysilicon 708 as a self-aligning mask to define channel length. It is of course possible to use also the first level polysilicon as the gate of some or all types of periphery transistors, in which case a second buried contact masking and etching is required to achieve electrical contact between the first and second level polysilicon. It is also possible to use N+ diffusions formed at the same time as when forming diffusions 741,742 as source/drain diffusions of periphery transistors.

Subsequent to source-drain formation in periphery devices the wafer is taken through a thermal oxidation to form an oxide approximately 1000 Å to 3000 Å thick on all exposed silicon or polysilicon surfaces. This protective oxide is then covered with a second deposited dielectric 777 (FIG. 7a), usually phosphorus glass or plasma assisted deposited silicon oxide or silicon nitride. The thickness of this layer is chosen to give good step coverage over the single or double polysilicon steps as well as a low capacitive coupling between the metal electrodes and the polysilicon control gate. The glass is flowed to improve step coverage, contacts are defined and etched, and the remainder of the process proceeds along industry-standard steps.

It is clear that the cells described above can be fabricated in other manners. For example, the memory cells can be fabricated in PMOS technology, or the periphery devices can be accomplished with CMOS circuitry. The manner in which the cells are read, written and refreshed can also be different than what has been described here and the above description is meant to be exemplary only, and not limiting. For example, current sensing rather than voltage sensing can be used for read, non-destructive, partially non-destructive and destructive read modes can be used, and there are several ways to implement multiple level storage and multiple level sensing. Various cells can be formed to optimize specific characteristics by changing the overlap areas and corresponding coupling capacitances between various elements of the cell.

What is claimed is:

1. A memory cell comprising:
   a substrate of a first conductivity type;
   a first region of second conductivity type formed in said substrate, said second conductivity type being opposite to said first conductivity type;
   second, third, and fourth regions of said first conductivity type formed in said first region of said second conductivity type, said second and third regions being separated by a first portion of said first region and said third and fourth regions being separated by a second portion of said first region;
   a fifth region of said first conductivity type formed in said second portion of said first region;
   a first electrode attached to said fifth region, said first electrode being electrically isolated from said second, third, and fourth regions, said first electrode extending on insulation over said first portion to said second region and also extending over said third region and a part of said second portion, said first electrode being covered by second insulation;
   a word line formed over said second insulation so as to overlie said first electrode and said second portion between said third region and said fifth region, said first electrode and said word line forming a dual electrode, said dual electrode structure forming a read transistor with channel length measured by the separation between said second region and said third region, a write transistor with channel length measured by the separation between said third region and said fifth region, and a storage junction formed between said fifth region and said first region;
   wherein the conductivity state of the channel region of said write transistor with channel length measured by the separation between said third region and said fifth region is controlled entirely by said word line which has a portion thereof extending over said second portion of said first region extending between said third region and said fifth region and being separated from said second portion of said first region by insulation of approximately the same thickness as the insulation separating said first electrode from said first portion.

2. Structure as in claim 1 including means for maintaining the voltage on said first region of said second conductivity type sufficiently different than the voltages on said second, third, fourth and fifth regions of said first conductivity type to ensure that said fifth region is reverse-biased relative to said first region for all memory storage states.

3. Structure as in claim 1 wherein said fourth region comprises field oxide and wherein said fifth region is allowed to abut said field oxide.

4. A memory cell as in claim 3 including means for providing any one of several different memory cell states by having a corresponding one of several different voltages on said third region during the time said word line is momentarily brought to a more positive voltage than the gate to source threshold voltage of said write transistor.

5. Structure as in claim 3 wherein said second region of said first conductivity type comprises a common source with an adjacent mirror image memory cell.

6. Structure as in claim 3 wherein said third region of said first conductivity type comprises a drain diffusion of said read transistor of one memory cell and also comprises a virtual ground source diffusion of the read transistor of an adjacent memory cell in an array.

7. Structure as in claim 3 wherein said substrate is of the same second conductivity type as said first region.

8. Structure as in claim 3 including means for maintaining the voltage on said first region of said second conductivity type sufficiently different than the voltages on said second, third, fourth and fifth regions of said first conductivity type to ensure that said fifth region is reverse-biased relative to said first region for all memory storage states.

9. Structure as in claim 3 wherein said first electrode extends over only a part of said first portion between said second region and said third region and said word line has a portion thereof extending over the remainder of said portion between said second region and said third region and being separated from said first portion of said first region by insulation of approximately the same thickness as the insulation separating said first electrode from said first portion.

10. Structure as in claim 3 wherein said first region of said second conductivity type is shared commonly with a second memory cell and said second region of said first conductivity type comprises a common source with an adjacent mirror image memory cell.

11. Structure as in claim 3 wherein said third region comprises the source of a write transistor, the drain of which is said fifth region, and wherein the threshold voltage on the write transistor is varied by varying the source voltage on said third region.

12. Structre as in claim 3 wherein said third region comprises the source of a write transistor, the drain of which is said fifth region, and wherein the threshold voltage of the write transistor is different from the threshold voltage of the read transistor.

13. Structure as in claim 3 including a sense amplifier connected to said third region, said sense amplifier including a reference memory cell constructed with a coupling capacitance between said third region and said first electrode different than for the memory cell being read.

14. Structure as in claim 3 comprising a reference memory cell having a threshold state during reading intermediate to that of other memory cells used for the storage of information, said intermediate threshold state being obtained by having a voltage during writing on the third region of said reference memory cell different than the voltage during writing on the third regions of the other memory cells.

15. A memory array formed from the cells of claim 3, said memory array comprising a plurality of memory cells each of the structure of claim 3 separated by heavily diffused regions in the surface of the semiconductor material in which said cells are formed of the second conductivity type, said heavily diffused regions comprising channel stop regions for isolating the cells sharing the same column, wherein each cell in said same column has a common drain diffusion, a common source diffusion, and an individual isolated storage junction.

16. Structure as in claim 3 wherein said third region is the drain and said fifth region is the source of said write transistor.

17. A memory cell as in claim 16 including means for non-destructively reading the state of said cell by raising the voltage on said word line to a voltage sufficiently high to turn on that part of the channel of the read transistor which is controlled by said word line but not high enough to turn on the write transistor by virtue of the higher gate to source threshold voltage of said write transistor.

18. Structure as in claim 3 wherein the threshold voltage of said write transistor is different from the threshold voltage of said read transistor.

19. A memory cell as in claim 18 including means for non-destructively reading the state of said cell by raising the voltage on said word line to a voltage sufficiently high to turn on that part of the channel of the read transistor which is controlled by said word line but not high enough to turn on the write transistor by virtue of the higher gate to source threshold voltage of said write transistor.

20. Structure as in claim 3 wherein the threshold voltage of said write transistor is 0.5 volts to 3 volts higher than the threshold voltage of said read transistor.

21. A memory cell as in claim 20 including means for non-destructively reading the state of said cell by raising the voltage on said word line to a voltage sufficiently high to turn on that part of the channel of the read transistor which is controlled by said word line but not high enough to turn on the write transistor by virtue of the higher gate to source threshold voltage of said write transistor.

22. Structure as in claim 3 including means for varying the state of charge on said first electrode attached to said fifth region by varying the voltage on said third region of said write transistor while keeping said write transistor in its conducting state by raising the voltage of said word line above the threshold voltage of said write transistor, wherein said first electrode is strongly capacitively coupled to a field plate held at a fixed voltage.

23. A memory cell as in claim 22 wherein said first electrode overlies said word line.

24. A memory cell as in claim 22 wherein said field plate is formed in another conductive layer and has a substantial overlap with said first electrode.

25. A memory cell comprising:
a substrate of a first conductivity type;
a first region of second conductivity type formed in said substrate, said second conductivity type being opposite to said first conductivity type;
second, third, and fourth regions of said first conductivity type formed in said first region of said second conductivity type, said second and third regions being separated by a first portion of said first region and said third and fourth regions being separated by a second portion of said first region;
a fifth region of said first conductivity type formed in said second portion of said first region;
a first electrode attached to said fifth region, said first electrode being electrically isolated from said second, third, and fourth regions, said first electrode extending on insulation over said first portion to said second region and also extending over said third region and a part of said second portion, said first electrode being covered by second insulation;
a word line formed over said second insulation so as to overlie said first electrode and said second portion between said third region and said fifth region, said first electrode and said word line forming a dual electrode, said dual electrode structure forming a read transistor with channel length measured by the separation between said second region and said third region, a write transistor with channel length measured by the seapration between said third region and said fifth region, and a storage junction formed between said fifth region and said first region; and
means for maintaining the voltage on said first region of said second conductivity type sufficiently different than the voltages on said second, third, fourth and fifth regions of said first conductivity type to insure that said fifth region is reverse-biased relative to said first region for all memory storage states.

26. Structure as in claim 25 wherein said third and fourth regions of said first conductivity type are used as drain diffusion of one memory cell and as the virtual ground source diffusion of another memory cell.

27. Structure as in claim 26 wherein the second region comprises a source of a read transistor which is shared with an adjacent mirror image memory cell formed in the same first region as said memory cell.

* * * * *